US011309355B2

United States Patent
Lin et al.

(10) Patent No.: US 11,309,355 B2
(45) Date of Patent: Apr. 19, 2022

(54) DISPLAY DEVICE

(71) Applicant: InnoLux Corporation, Miao-Li County (TW)

(72) Inventors: Hsiao-Lang Lin, Miao-Li County (TW); Tsung-Han Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/395,272

(22) Filed: Apr. 26, 2019

(65) Prior Publication Data

US 2020/0343315 A1    Oct. 29, 2020

(51) Int. Cl.
*H01L 27/32* (2006.01)
*H01L 51/50* (2006.01)
*H01L 51/52* (2006.01)

(52) U.S. Cl.
CPC ........ *H01L 27/3211* (2013.01); *H01L 27/322* (2013.01); *H01L 27/3246* (2013.01); *H01L 27/3272* (2013.01); *H01L 51/5012* (2013.01); *H01L 51/5228* (2013.01)

(58) Field of Classification Search
None
See application file for complete search history.

(56) References Cited

U.S. PATENT DOCUMENTS

| | | | | |
|---|---|---|---|---|
| 7,265,391 B2* | 9/2007 | Yamazaki | ........... | H01L 27/3276 257/88 |
| 7,692,186 B2* | 4/2010 | Yamazaki | ............. | H01L 27/322 257/40 |
| 8,089,066 B2* | 1/2012 | Yamazaki | ........... | H01L 27/3276 257/40 |
| 8,779,467 B2* | 7/2014 | Yamazaki | ........... | H01L 27/3216 257/184 |
| 9,312,323 B2* | 4/2016 | Yamazaki | ........... | H01L 27/3279 |
| 9,627,459 B2* | 4/2017 | Yamazaki | ........... | H01L 27/3248 |
| 2005/0012105 A1* | 1/2005 | Yamazaki | ........... | H01L 27/3272 257/79 |
| 2005/0212413 A1* | 9/2005 | Matsuura | ............ | H01L 51/5212 313/504 |

(Continued)

FOREIGN PATENT DOCUMENTS

EP          1 331 666 A2    7/2003
EP          1 331 666 A3    10/2009

*Primary Examiner* — Abul Kalam
(74) *Attorney, Agent, or Firm* — Winston Hsu

(57) ABSTRACT

The present disclosure provides a display device including a cathode electrode, a first anode electrode, a second anode electrode, a first light emitting layer, a first light conversion layer, a second light emitting layer, a second light conversion layer and an auxiliary electrode. The first light emitting layer is disposed between the cathode electrode and the first anode electrode. The first light conversion layer is disposed above the first light emitting layer. The second light emitting layer is disposed between the cathode electrode and the second anode electrode. The second light conversion layer is disposed above the second light emitting layer. The auxiliary electrode is electrically connected to the cathode electrode, and a portion of the auxiliary electrode is between the first light conversion layer and the second light conversion layer in a top view direction of the display device.

20 Claims, 13 Drawing Sheets

(56) References Cited

U.S. PATENT DOCUMENTS

| | | | |
|---|---|---|---|
| 2007/0108899 A1* | 5/2007 | Jung | ............ H01L 51/5203 |
| | | | 313/506 |
| 2009/0066236 A1* | 3/2009 | Sung | ............ H01L 27/3279 |
| | | | 313/504 |
| 2010/0156273 A1 | 6/2010 | Utsunomiya | |
| 2011/0220901 A1 | 9/2011 | Ha | |
| 2013/0240864 A1 | 9/2013 | Ha | |
| 2013/0313539 A1 | 11/2013 | Ha | |
| 2015/0270327 A1 | 9/2015 | Oh | |
| 2016/0043156 A1 | 2/2016 | Ha | |
| 2016/0203765 A1 | 7/2016 | Lee | |
| 2017/0069705 A1 | 3/2017 | Cao | |
| 2017/0256598 A1 | 9/2017 | Ha | |
| 2019/0115546 A1 | 4/2019 | Lu | |

* cited by examiner

DISPLAY DEVICE

BACKGROUND OF THE DISCLOSURE

1. Field of the Disclosure

The present disclosure relates to a display device, and more particularly to a display device with increased brightness uniformity.

2. Description of the Prior Art

The display devices are widely used. As the size of the display device increases, the brightness uniformity decreases and the quality of the display device are affected. Therefore, efforts are being made to improve the brightness uniformity of the display devices.

SUMMARY OF THE DISCLOSURE

According to an embodiment, the present disclosure provides a display device including a cathode electrode, a first anode electrode, a second anode electrode, a first light emitting layer, a first light conversion layer, a second light emitting layer, a second light conversion layer and an auxiliary electrode. The first light emitting layer is disposed between the cathode electrode and the first anode electrode. The first light conversion layer is disposed above the first light emitting layer. The second light emitting layer is disposed between the cathode electrode and the second anode electrode. The second light conversion layer is disposed above the second light emitting layer. The auxiliary electrode is electrically connected to the cathode electrode, and a portion of the auxiliary electrode is between the first light conversion layer and the second light conversion layer in a top view direction of the display device.

According to another embodiment, the present disclosure provides a display device including a first light emitting unit, a second light emitting unit and an auxiliary electrode. The second light emitting unit is disposed adjacent to the first light emitting unit. The auxiliary electrode is electrically connected to the first light emitting unit and the second light emitting unit, and a portion of the auxiliary electrode is disposed between the first light emitting unit and the second light emitting unit in a top view direction of the display device.

These and other objectives of the present disclosure will no doubt become obvious to those of ordinary skill in the art after reading the following detailed description of the embodiment that is illustrated in the various figures and drawings.

DETAILED DESCRIPTION

Figure 1:
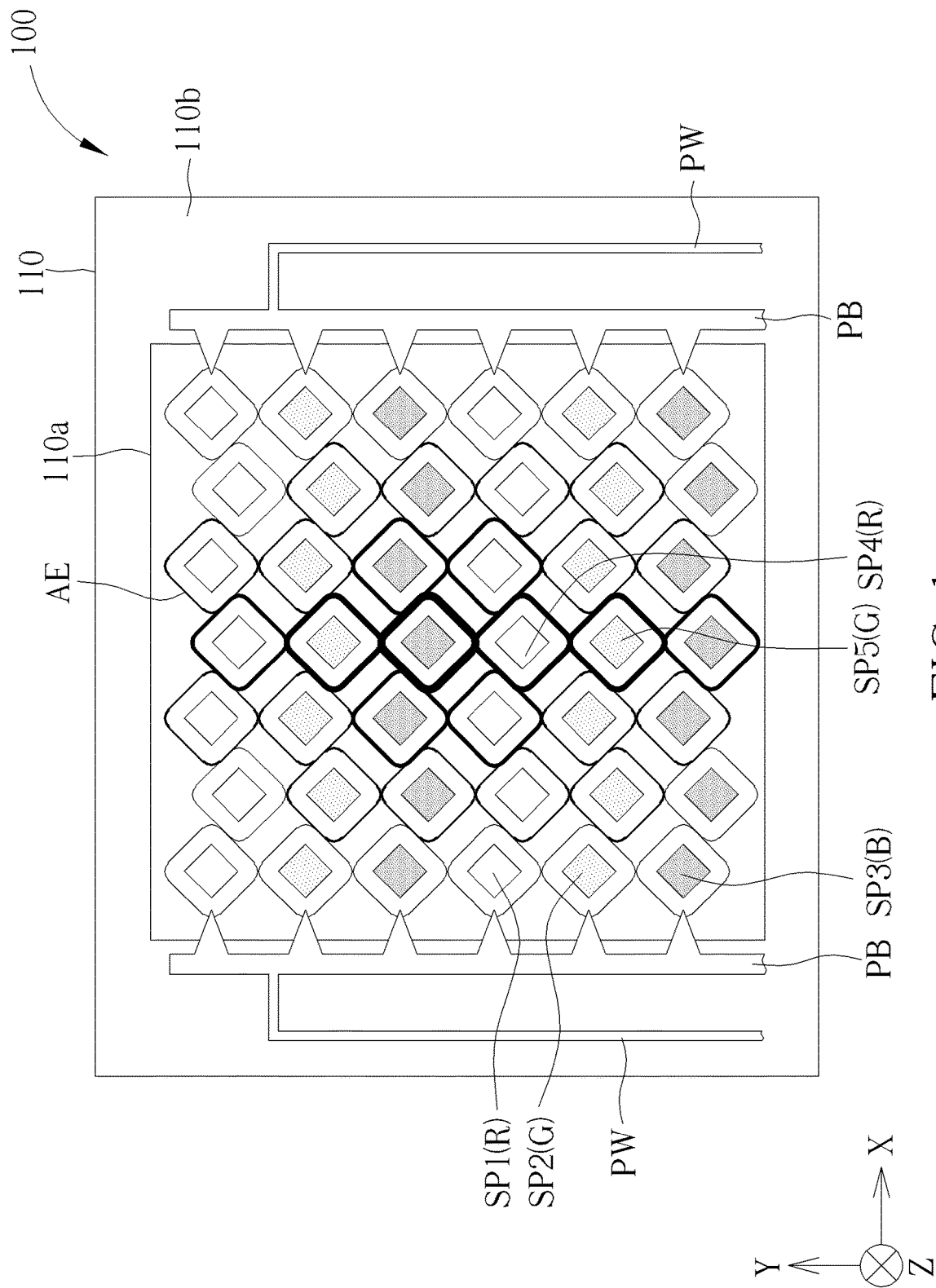
FIG. 1 is a schematic diagram showing a top view of a display device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of a display device in this disclosure, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

When the corresponding component such as layer or area is referred to "on another component (or the variant thereof)" or "extend to another component", it may be directly on another component or directly extend to another component, or other component may exist between them.

On the other hand, when the component is referred to "directly on another component (or the variant thereof)" or "directly extend to another component", any component does not exist between them.

It will be understood that when an element or layer is referred to as being "connected to" or "contacted with" another element or layer, it can be directly connected to (or directly contacted with) the other element or layer, or intervening elements or layers may be presented. In contrast, when an element is referred to as being "directly connected to" or "directly contacted with" another element or layer, there are no intervening elements or layers presented. In addition, when the component is referred to "be coupled to/with another component (or the variant thereof)", it may be directly connected to another component, or may be indirectly connected to another component through other component. In contrast, when an element is referred to as being "disposed on" or "disposed above" B1 element, it may be directly disposed on (or disposed above) B1 element, or may be indirectly disposed on (or disposed above) B1 element through other component. In contrast, when an element is referred to as being "disposed between" B1 element and B2 element, it may be directly disposed between B1 element and B2 element, or may be indirectly disposed between B1 element and B2 element through other component.

It will be understood that when "a portion of a structure" is between another two components, this structure can be totally between or partially between these components.

The terms "about", "substantially", "equal", or "$_{same}$" generally mean within 20% of a given value or range, or mean within 10%, 5%, 3%, 2%, 1%, or 0.5% of a given value or range.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

In the present disclosure, the display device may be such as a LEDs (light-emitting diodes) display, a micro-LEDs display, a mini-LEDs display, an OLEDs (organic light-emitting diodes) display, a quantum dots LEDs (QLEDs or QD-LEDs) display, a flexible display or any other suitable display.

Figure 2:
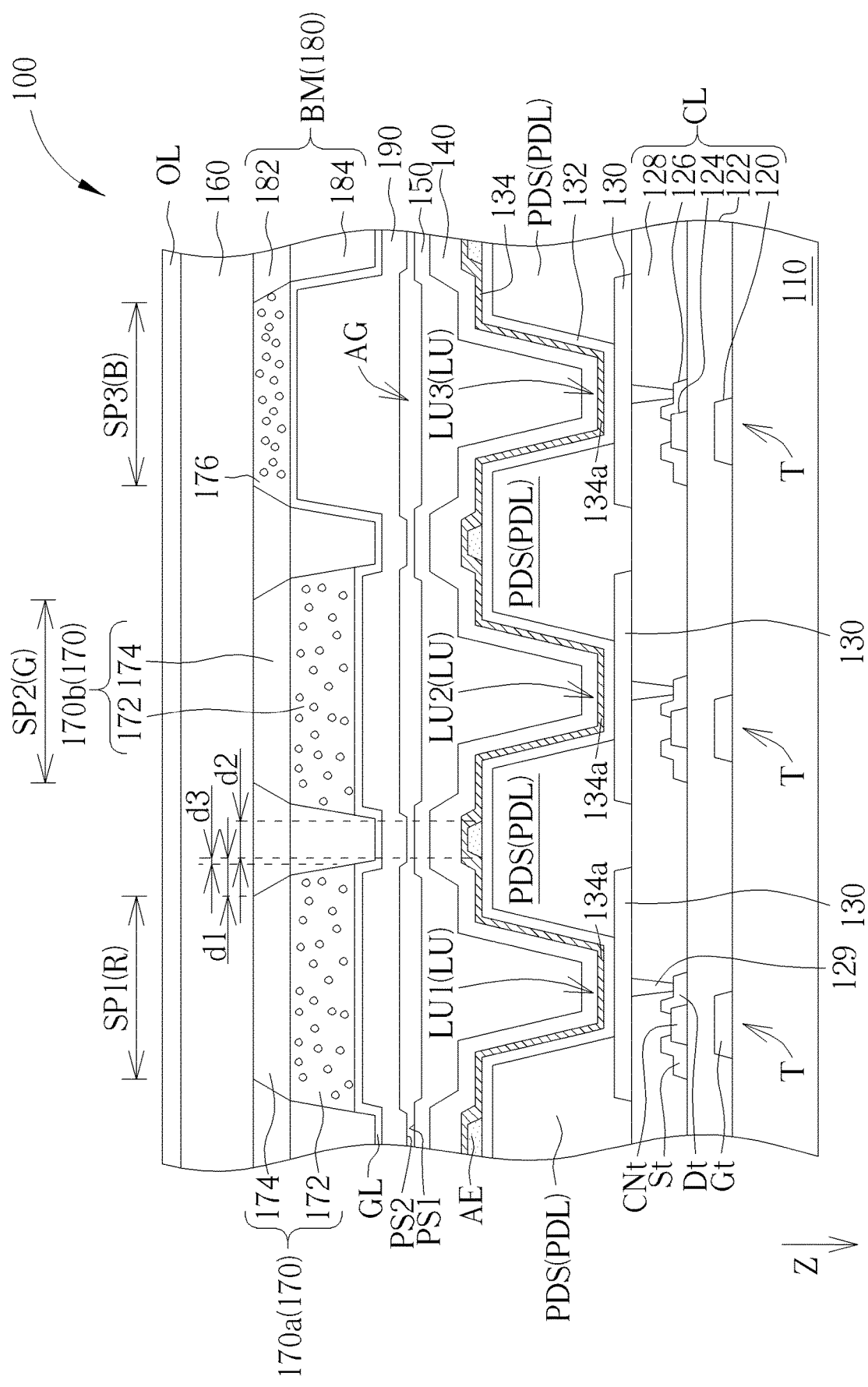
FIG. 2 is a schematic diagram showing a cross-sectional view of a display device according to the first embodiment of the present disclosure.
Figure 3:
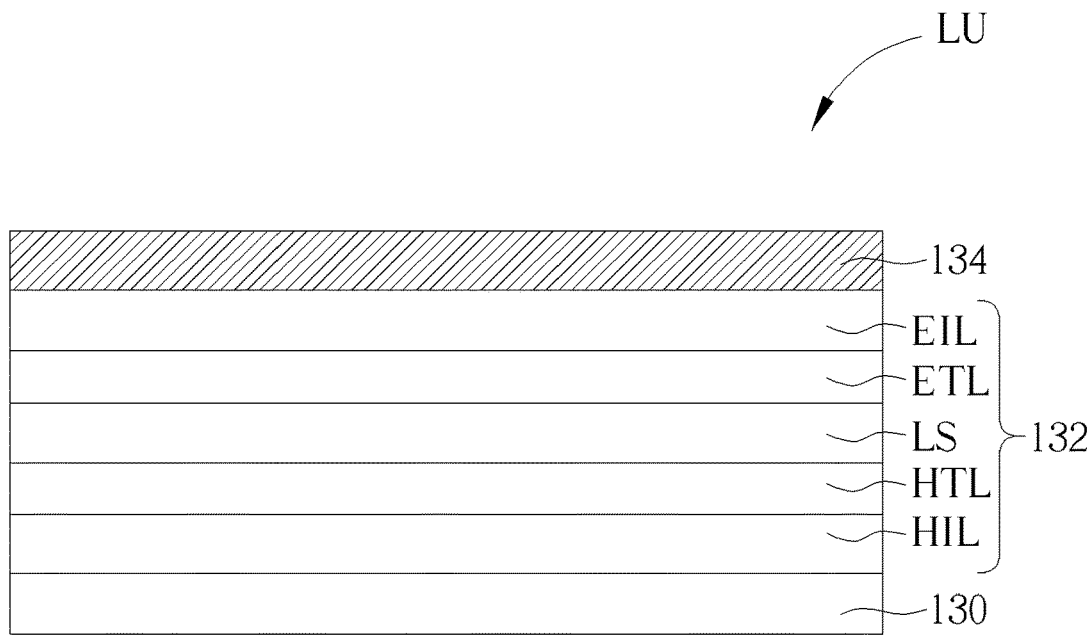
FIG. 3 is a schematic diagram showing a cross-sectional view of a light emitting layer according to the first embodiment of the present disclosure.
Figure 4:
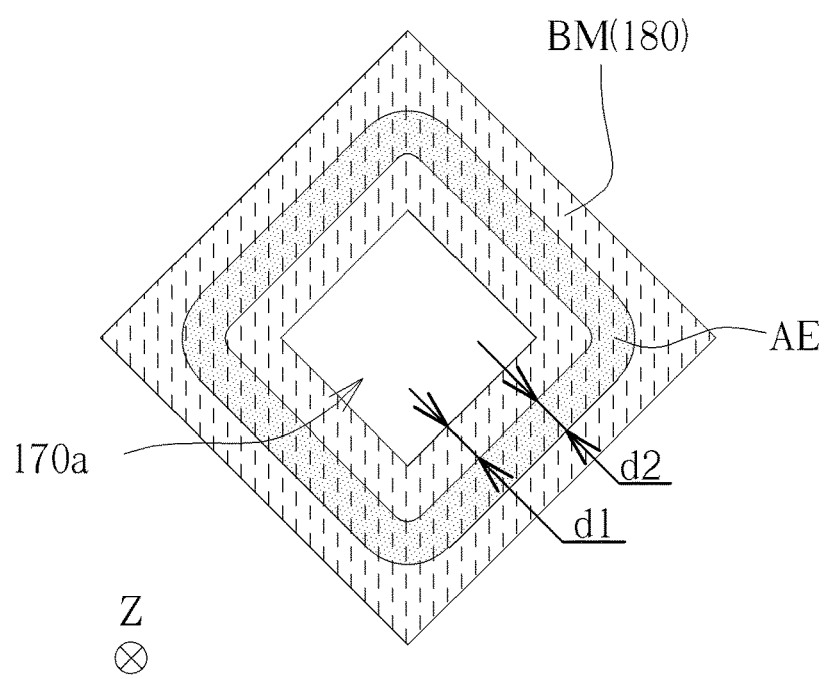
FIG. 4 is a schematic diagram showing a top view of a light conversion layer, an auxiliary electrode and a light shielding layer of a display device according to the first embodiment of the present disclosure.

Referring to FIG. 1 to FIG. 4, FIG. 1 is a schematic diagram showing a top view of a display device according to a first embodiment, FIG. 2 is a schematic diagram showing a cross-sectional view of a display device according to the first embodiment, FIG. 3 is a schematic diagram showing a cross-sectional view of a light emitting layer according to the first embodiment, and FIG. 4 is a schematic diagram showing a top view of a light conversion layer, an auxiliary electrode and a light shielding layer of a display device according to the first embodiment, wherein FIG. 2 only shows a first sub-pixel SP1, a second sub-pixel SP2 and a third sub-pixel SP3, but not limited thereto. As shown in FIG. 1, the display device 100 includes a display region 110a and a peripheral region 110b, and the peripheral region 110b is situated at one or more side(s) of the display region 110a and configured to dispose such as driving circuit(s), integrated circuit(s), peripheral pad(s) and/or peripheral wire(s) thereon. In some embodiment, the peripheral region 110b may surround the display region 110a, but not limited thereto. A plurality of pixels are disposed in and correspond to the display region 110a, the display region 110a may be defined by a region includes all sub-pixels. It should be noted that the scope or position of the display region 110a (and/or a peripheral region 110b) are only for example, but not limited thereto. In some embodiment, one pixel may include a plurality of sub-pixels. For example, the pixel may include a sub-pixel R emitting red light, a sub-pixel G emitting green light and/or a sub-pixel B emitting blue light, but not limited thereto. Note that, in the peripheral region 110b, FIG. 1 only shows two peripheral wires PW and two peripheral pads PB, and omits other components to make FIG. 1 simple and clear, the peripheral wires PW disposed in the peripheral region 110b are electrically connected with the peripheral pads PB disposed in the peripheral region 110b, and the material of the peripheral wires PW may be the same as or different from the material of the peripheral pads PB.

As shown in FIG. 1 and FIG. 2, the display device 100 includes a substrate 110, a circuit layer structure CL, a plurality of light emitting units LU (such as the first light emitting unit LU1, the second light emitting unit LU2 and the third light emitting unit LU3), a pixel defining layer PDL, at least one auxiliary electrode AE, a plurality of light conversion layers 170 and a light shielding layer 180, but not limited thereto. The display device 100 may further include an opposite substrate 160, wherein the circuit layer structure CL, the light emitting units LU, the pixel defining layer PDL, the auxiliary electrode AE, the light conversion layers 170 and the light shielding layer 180 are disposed between the substrate 110 and the opposite substrate 160, but not limited thereto. The substrate 110 and the opposite substrate 160 may include a hard substrate or a flexible substrate, wherein the hard substrate may include a glass substrate, a plastic substrate, a quartz substrate, a sapphire substrate or other suitable hard substrate, and the flexible substrate may include polyimide (PI), polyethylene terephthalate (PET) and/or other suitable flexible material, but not limited thereto.

The circuit layer structure CL is disposed on the substrate 110, and the light emitting units LU and the pixel defining layer PDL are disposed on the circuit layer structure CL, wherein the circuit layer structure CL is disposed to drive the light emitting units LU for emitting light, and the pixel defining layer PDL is disposed to separate the light emitting units LU from each other to defined different light emitting units LU (such as the first light emitting unit LU1, the second light emitting unit LU2 and the third light emitting unit LU3). In some embodiments, one of the light emitting units LU may be correspond to and be included in one of the sub-pixels (such as the first sub-pixel SP1 (R), the second sub-pixel SP2 (G), the third sub-pixel SP3 (B). In some embodiments, the circuit layer structure CL may include wires, thin film transistors, capacitor or other suitable components, but not limited thereto. The light emitting units LU are electrically connected with the corresponding thin film transistors T. In some embodiments, the circuit layer structure CL may include a first conductive layer 120, a first insulating layer 122, a semiconductor layer 124, a second conductive layer 126 and a second insulating layer 128 disposed on the substrate 110 in sequence, but not limited thereto. Furthermore, a plurality of thin film transistors T, a plurality of data lines (not shown) and a plurality scan lines (not shown) are disposed on the substrate 110, and the circuit layer structure CL includes the plurality of thin film transistors T, the plurality of data lines (not shown) and the plurality scan lines (not shown). A gate electrode Gt of the thin film transistor T and the scan line may be formed of the same layer (such as the first conductive layer 120), but not limited thereto. It should be noted that, when "A is formed of B" are used in the description of the present disclosure, it may include that "A is formed of B only, or A is formed of B and/or another components or materials. A source electrode St and/or a drain electrode Dt of the thin film transistor T and the data line may be formed of the same layer (such as the second conductive layer 126), but not limited thereto. A channel layer CNt of the thin film transistor T may be formed of the same layer (such as the semiconductor layer 124), but not limited thereto.

As shown in FIG. 2, the thin film transistor T may be a bottom gate transistor, but not limited thereto. In some embodiment, the thin film transistor T may include a top gate transistor, a double gate transistor, a dual gate transistor, other suitable transistor or combination thereof, but not limited thereto. The type of the thin film transistor T and the disposition of the components or layers may be adjusted according to requirements.

The material of the conductive layers of the circuit layer structure CL may include metal and/or transparent conductive material, wherein the transparent conductive material can include indium tin oxide (ITO), indium zinc oxide (IZO), any other suitable conductive material or combination thereof, but not limited thereto. The material of the insulating layers of the circuit layer may include organic material or inorganic material. The material of the insulating layers of the circuit layer may include silicon oxide, silicon nitride, silicon oxynitride, any other suitable insulating material or combination thereof, but not limited thereto. The material of the semiconductor layer 124 of the circuit layer may include low temperature poly-silicon (LTPS), indium gallium zinc oxide (IGZO), amorphous silicon (a-Si), other suitable materials or combination thereof, but not limited thereto.

The light emitting unit LU may include a light emitting diode (LED), a micro-LED, a mini-LED, an organic light-emitting diode (OLED), a quantum dots LED (QLED or QD-LED) or any other suitable light-emitting component, but not limited thereto. The present disclosure uses the OLED to serve as the light emitting units LU for explanation, but the light emitting units LU in the display device may be other type light-emitting components. In FIG. 2, one of the light emitting units LU (such as the first light emitting unit LU1, the second light emitting unit LU2 and the third light emitting unit LU3) may include one of a plurality of first electrodes 130, a portion (such as a second electrode 134a) of a second electrode layer 134 and a portion of a light emitting layer 132 disposed between the first electrode 130 and the second electrode 134a. In some embodiments, the plurality of light emitting units LU may share a light emitting layer 132, but not limited thereto. In some embodiments, the light emitting layer 132 may disposed corresponding in at least one of the light emitting units LU. The second electrode layer 134 includes a plurality of second electrodes 134a, the second electrode layer 134 may disposed in the plurality of light emitting units LU. In some embodiments, the second electrode 134a may be defined by a portion of the second electrode layer 134 overlapped with the light emitting layer 132 and the corresponding first electrode 130 in a top view direction Z of the display device, wherein the top view direction Z of the display device may be the normal direction of the substrate 110. The first electrodes 130 are disposed between the light emitting layer 132 and the circuit layer structure CL and electrically connected to the thin film transistors T in the circuit layer structure CL (e.g. the first electrode 130 in FIG. 2 is electrically connected to the drain electrode Dt of the corresponding thin film transistor T through the connected structure 129, but not limited thereto). In some embodiments, the first electrode 130 may be an anode electrode, and the second electrode 134a may be a cathode electrode, but not limited thereto. Note that, the first electrode 130 of the first light emitting unit LU1 may be referred as a first anode electrode, the first electrode 130 of the second light emitting unit LU2 may be referred as a second anode electrode, and the first electrode 130 of the third light emitting unit LU3 may be referred as a third anode electrode, but not limited thereto. In some embodiments, the second electrode layer 134 may be an common cathode electrode and be provided a common voltage from the peripheral component through the peripheral wires PW (as shown in FIG. 1). In some embodiments, the material of the first electrode 130 may include metal, transparent conductive material or combination thereof. In some embodiments, the material of the second electrode layer 134 may include transparent conductive material, and the thickness of the second electrode layer 134 may be in a ranges from 20 Å to 800 Å (20 Å≤thickness≤800 Å) or from 20 Å to 300 Å (20 Å≤thickness≤300 Å), but not limited thereto.

As shown in FIG. 2 and FIG. 3, the light emitting layer 132 is disposed to emitting light, and the light emitting layer 132 may include a multi-layer structure, and the number and types of layers included in the light emitting layer 132 may be designed based on requirements. For example, the light emitting layer 132 shown in FIG. 3 may be disposed between the first electrode 130 and the second electrode layer 134, and the light emitting layer 132 include at least one hole injection layer HIL, at least one hole transport layer HTL, at least one light-emitting structure LS, at least one electron transport layer ETL and/or at least one electron injection layer EIL sequentially stacked on the first electrode 130, but not limited thereto. The light emitted from the light emitting unit LU is generated by the light-emitting structure LS.

Note that, in FIG. 2, the pixel defining layer PDL includes a plurality of pixel defining structures PDS, and the light emitting units LU (such as the first light emitting unit LU1, the second light emitting unit LU2 and the third light emitting unit LU3) is situated between adjacent pixel defining structures PDS. In some embodiment (FIG. 2), the sub-pixels (such as SP1 (R), SP2 (G), SP3 (B)) may be defined by the light shielding structures BM, but not limited thereto. In some embodiment, the display device does not include the light shielding structures BM, and the sub-pixels (such as SP1 (R), SP2 (G), SP3 (B)) may be defined by the pixel defining layer PDL, for example, the pixel defining layer PDL includes a plurality of openings to separate or form the pixel defining structures PDS, and a region of the sub-pixel (such as SP1 (R), SP2 (G) and SP3 (B)) may be defined by a region of the corresponding opening in the top view direction Z of the display device. In some embodiments, the light emitting layer 132 and the second electrode layer 134 may cross over the pixel defining structures PDS to form continuous layers, but not limited thereto. On the other hand, since a portion of the light emitting layer 132 in FIG. 2 may overlap the pixel defining layer PDL and not correspond to and electrically connected with the first electrode 130, this portion of the light emitting layer 132 may not emit light.

As shown in FIG. 2, the light conversion layers 170 and the light shielding layer 180 may be disposed above (or on) the light emitting units LU, and the light conversion layers 170 may be separated by the light shielding layer 180 in the top view direction Z of the display device. The light conversion layers 170 is disposed to convert the color of the light emitting from corresponding light emitting unit(s) LU. For instance, in this embodiment, the light emitting units LU emit blue light (or other color light), and the light conversion layers 170 may convert the blue light (or other color light) to red light, green light or the light with any other suitable color. In some embodiments, the light emitting units LU emit white light, the light conversion layers 170 may convert or filter the white light to red light, green light, blue light or the light with any other suitable color. The material of the light conversion layers 170 may include quantum dots, color filter, phosphorescent materials or any other suitable material, but not limited thereto. In some embodiment (FIG. 2), the light conversion layers 170 may include a first conversion part 172 and a second conversion part 174 disposed on the first conversion part 172, the first conversion part 172 includes the quantum dots, and the second conversion part 174 includes the color filter, but not limited thereto. In some embodiments, the light emitting units LU may emit blue light, the first conversion part 172 may convert the blue light to red light or green light, but not limited thereto. In some embodiments, the second conversion part 174 may absorb or filter the blue light or other light (such as UV light), but not limited thereto. The light shielding layer 180 may be disposed to shield opaque or reflective components, block the unwanted light and/or separate the sub-pixels from each other. The light shielding layer 180 may include a plurality of light shielding structures BM disposed between the light conversion layers 170 in the top view direction Z of the display device. In some embodiments, the light shielding structure BM may overlap with the corresponding pixel defining structures PDS in the top view direction Z of the display device, but not limited thereto. In some embodiments, the light shielding layer 180 may include a single-layer or a multi-layer structure. For example (FIG. 2), the light shielding layer 180 may have, but not limited to, two sub-layers 182, 184, and the material of the light shielding layer 180 may include a photoresist material, an organic material, a metal material or any other suitable material, but not limited thereto. The material of sub-layers 182, 184 may be the same or different.

In FIG. 2, since the light emitting units LU may emit blue light, the light conversion layers 170 are included in the sub-pixels, such as the first sub-pixel SP1 (R), the second sub-pixel SP2 (G), and the light conversion layers 170 are not included in the third sub-pixels SP3 (B), but not limited thereto. On the other hand, a scattering layer 176 may be included in the third sub-pixel SP3 (B), and the scattering layer 176 may include a plurality of particles for scattering the blue light, but not limited thereto. In some embodiments, the light emitting units LU may emit blue light or UV light, the light conversion layers 170 are included in the first sub-pixel SP1 (R), the second sub-pixel SP2 (G) and the third sub-pixel SP3 (B), and the blue light or UV light may be converted to the light with suitable wavelengths by the light conversion layers 170, but not limited thereto.

In the present disclosure, the display device 100 includes the auxiliary electrode AE electrically connected with the second electrode 134a, and the uniformity of the brightness of the display device 100 may be increased. In some embodiments, the auxiliary electrode AE may be overlapped with a portion of the second electrode layer 134 in the top view direction Z of the display device. In some embodiments, the auxiliary electrode AE is electrically connected with the second electrode layer 134, and the resistance of the auxiliary electrode AE is less than the resistance of the second electrode layer 134, such that the uniformity of the brightness may be increased.

In some embodiments, the thickness of the auxiliary electrode AE is greater than or equal to 0.1 μm and less than or equal to 0.3 μm, but not limited thereto. In some embodiments, the thickness of the auxiliary electrode AE is greater than or equal to 0.15 μm and less than or equal to 0.2 μm, but not limited thereto. The thickness of the auxiliary electrode AE may be defined by a maximum thickness along the top view direction Z of the display device measured by any SEM image. In some embodiments, the width d2 of the auxiliary electrode AE is greater than or equal to 1.5 μm and less than or equal to 8 μm (1.5 μm≤d2≤8 μm), but not limited thereto. In some embodiments, the width d2 of the auxiliary electrode AE is greater than or equal to 3 μm and less than or equal to 5 μm (3 μm≤d2≤5 μm). The width d2 of the auxiliary electrode AE may be defined by a maximum width measured by any SEM image or OM image. In some embodiments (FIG. 3 and FIG. 2), the thickness of the auxiliary electrode AE may be greater than the thicknesses of the second electrode layer 134, the hole injection layer HIL, the hole transport layer HTL, the electron transport layer ETL, the electron injection layer EIL and/or the charge generating layer (not shown in FIG. 3), but not limited thereto. In some embodiments, the thickness of the auxiliary electrode AE may be less than the thicknesses of the first conversion part 172, the second conversion part 174 and/or the light shielding layer 180. The above thickness of the layers or components may be defined by a maximum thickness along the top view direction Z of the display device measured by any SEM image. In some embodiments (not shown), the cross-sectional profile of the auxiliary electrode AE may include a triangle, a trapezoid, a rectangle, a polygon, a circle, a shape having curved edge, any other suitable shape or combination thereof, but not limited thereto. In some embodiments, the material of the auxiliary electrode AE may include metal, transparent conductive material, any other suitable conductive material or combination thereof. In some embodiments, the material of the auxiliary electrode AE may be the same as or different from the material of the second electrode layer 134 and/or the first electrode 130.

In some embodiments, a portion of the auxiliary electrode AE may be disposed between two adjacent light emitting units LU in the top view direction Z of the display device. In order to describe in detail, one of the sub-pixels R (red sub-pixels) may be referred as a first sub-pixel SP1, one of the sub-pixels G (green sub-pixels) may be referred as a second sub-pixel SP2, and one of the sub-pixels B (blue sub-pixels) may be referred as a third sub-pixel SP3 (as shown in FIG. 1 and FIG. 2), wherein the first sub-pixel SP1, the second sub-pixel SP2 and the third sub-pixel SP3 may be disposed adjacent to the peripheral pad PB disposed in the peripheral region 110b, and the second sub-pixel SP2 is disposed between the first sub-pixel SP1 and the third sub-pixel SP3. In some embodiments, as shown in FIG. 1 and FIG. 2, the first sub-pixel SP1 may include at least one thin film transistor T, a first light emitting unit LU1 and a first light conversion layer 170a, the second sub-pixel SP2 may include at least one thin film transistor T, a second light emitting unit LU2 and a second light conversion layer 170b, and the third sub-pixel SP3 may include at least one thin film transistor T, a third light emitting unit LU3 and the scattering layer 176, but not limited thereto. In FIG. 1, the top view pattern of the auxiliary electrode AE includes a rectangular pattern with curved corners, the auxiliary electrode AE may surround at least one sub-pixel (or at least one pixel), and the auxiliary electrodes AE may be combined in the mesh shape, but not limited thereto. More specifically, the auxiliary electrode AE may surround (or be adjacent to) the first light conversion layer 170a, and a portion of the auxiliary electrode AE may be disposed between the first light emitting unit LU1 in the first sub-pixel SP1 and the second light emitting unit LU2 in the second sub-pixel SP2 in top view direction Z of the display device. In other words, the auxiliary electrode AE has a portion disposed between the first light conversion layer 170a and the second light conversion layer 170b in the top view direction Z of the display device.

In FIG. 2, the auxiliary electrode AE may be overlapped with the pixel defining layer PDL and/or the light shielding layer 180 in the top view direction Z of the display device. In some embodiments (FIG. 2), the auxiliary electrode AE is disposed between the pixel defining layer PDL and the light shielding layer 180 in the normal direction Z of the substrate 110. In some embodiments (FIG. 2), the auxiliary electrode AE is disposed between the pixel defining layer PDL and the second electrode layer 134 in the normal direction Z of the substrate 110. In some embodiments (not shown), the auxiliary electrode AE is disposed on the second electrode layer 134. In some embodiments, the width of the auxiliary electrode AE may be less than the width of the corresponding light shielding structure BM and/or the width of the corresponding pixel defining structure PDS, and the quality of the display device 100 may enhance. In some embodiments, the projected area of the auxiliary electrode AE on the substrate 110 may be less than the projected area of the corresponding light shielding structure BM on the substrate 110 in the top view direction Z of the display device. Note that the projected area of a component is defined by an area of the component projected on the surface of the substrate 110 along the top view direction Z, but not limited thereto. In some embodiments, as shown in FIG. 2 and FIG. 4, a minimum distance d3 between the auxiliary electrode and the first light conversion layer 170a in the top view direction Z of the display device is greater than or equal to 0.5 μm and less than or equal to 10 μm, but not limited thereto. In some embodiments, the light shielding structure BM and the first light conversion layer 170a are disposed on the same substrate (such as the opposite substrate 160) or different substrates, the minimum distance d3 between the auxiliary electrode and the first light conversion layer 170a may be measured by any SEM image, but not limited thereto. In some embodiments, the light shielding structure BM may overlap with the first light conversion layer 170a in the top view direction Z of the display device.

In some embodiments, as shown in FIG. 2 and FIG. 4, a distance d1 may be defined by a minimum distance between an outline of a projected area of the light shielding structure BM on the substrate 110 and an outline of a projected area of the auxiliary electrode AE on the substrate 110 in the top view direction Z of the display device, and the distance d1 is greater than or equal to 0.5 μm and less than or equal to 10 μm (0.5 μm≤d1≤10 μm), but not limited thereto. In some embodiments, the light shielding structure BM and the auxiliary electrode AE are disposed on the same substrate or different substrates, the distance d1 may be measured by any SEM image, but not limited thereto. In some embodiments, a ratio of the minimum distance d1 to a width d2 of the auxiliary electrode AE is greater than or equal to 0.06 and less than or equal to 1.4 (0.06≤d1/d2≤1.4), but not limited thereto. In some embodiments (FIG. 2), the auxiliary electrode AE may be not overlapped with the light emitting layer 132 in the top view direction Z of the display device. In some embodiments, the auxiliary electrode AE shown in FIG. 2 is disposed between the second electrode layer 134 and the light emitting layer 132. For example, a top surface of the auxiliary electrode AE and/or a side surface of the auxiliary electrode AE may be in contact with the second electrode layer 134, and the bottom surface of the auxiliary electrode AE may be in contact with the light emitting layer 132, but not limited thereto. In some embodiment (FIG. 2), the second electrode layer 134 may cover the auxiliary electrode AE. In some embodiments, an anti-oxidizing layer (not shown) may disposed on or cover the auxiliary electrode AE to reduce the oxidation of the auxiliary electrode AE.

In some embodiments, the material (such as metal) of the auxiliary electrode AE with the reflective property may reflect the light emitting from the light emitting unit LU to the light conversion layer 170, and then, the utilization rate of the light may be enhanced, so as to increase the brightness of the display device 100. In some embodiments, the reflectivity of the auxiliary electrode AE may be greater than the second electrode layer 134 and/or the conductive layer of the circuit layer structure CL, but not limited thereto. In some embodiments, the cross-sectional profile of the auxiliary electrode AE may be designed based on the required reflective angle of the light.

In some embodiments, the auxiliary electrodes AE may have different widths, different thicknesses, different lengths and/or different surrounding areas or projected areas on the substrate 110. As shown in FIG. 1, the peripheral pad PB is electrically connected with the peripheral wire PW and the auxiliary electrode AE. In some embodiments, the auxiliary electrode AE may be in contact with the peripheral pad PB, the signal (e.g. the common voltage, but not limited thereto) may pass through the peripheral wire PW, the peripheral pad PB, the auxiliary electrode AE to the second electrode layer 134 in sequence, but not limited thereto. Thus, in some embodiment (FIG. 1), the width of the auxiliary electrode AE is greater as the distance between the auxiliary electrode AE and the peripheral pad PB is increased, which increases the electrical property of the auxiliary electrode AE. In order to describe in detail, one of the sub-pixels R close to the center of the display region 110a may be referred as a fourth sub-pixel SP4, and one of the sub-pixels G close to the center of the display region 110a may be referred as a fifth sub-pixel SP5 in FIG. 1, and the first sub-pixel SP1 (R) and the second sub-pixel SP2 (G) are adjacent to the peripheral pad PB disposed in the peripheral region 110b, and the first width of the auxiliary electrode AE surrounding the first sub-pixel SP1 (R) may be less than the second width of the auxiliary electrode AE surrounding the fourth sub-pixel SP4 (R). In some embodiments, a ratio of the first width to the second width is greater than or equal to 0.1 and less than 1, but not limited thereto. In some embodiments, the width of the auxiliary electrode AE surrounding the second sub-pixel SP2 (G) may be less than the width of the auxiliary electrode AE surrounding the fifth sub-pixel SP5 (G). In some embodiments, the peripheral pads PB are disposed on the two opposite sides (such as left side and the right side, but not limited thereto). In another embodiment (not shown), the display device 100 has one peripheral pad PB disposed on the one side (such as left side), the width of the auxiliary electrode AE disposed at the side portion (such as left portion of the display region 110a) close to the peripheral pad PB is less than the width of the auxiliary electrode AE disposed at the intermediate portion of the display region 110a, and the width of the auxiliary electrode AE disposed at the intermediate portion of the display region 110a is less than the width of the auxiliary electrode AE disposed at the side portion (such as right portion of the display region 110a) away to the peripheral pad PB, but not limited thereto.

Figure 5:
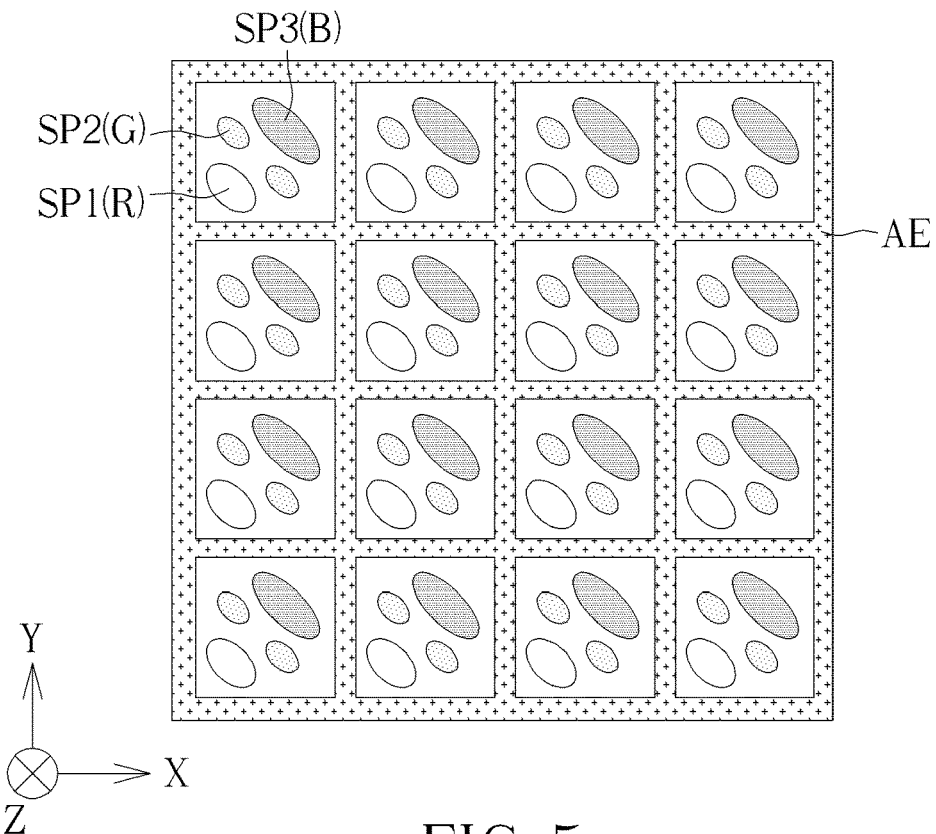
FIG. 5 is a schematic diagram showing a top view of sub-pixels and auxiliary electrodes of a display device according to another embodiment of the present disclosure.
Figure 6:
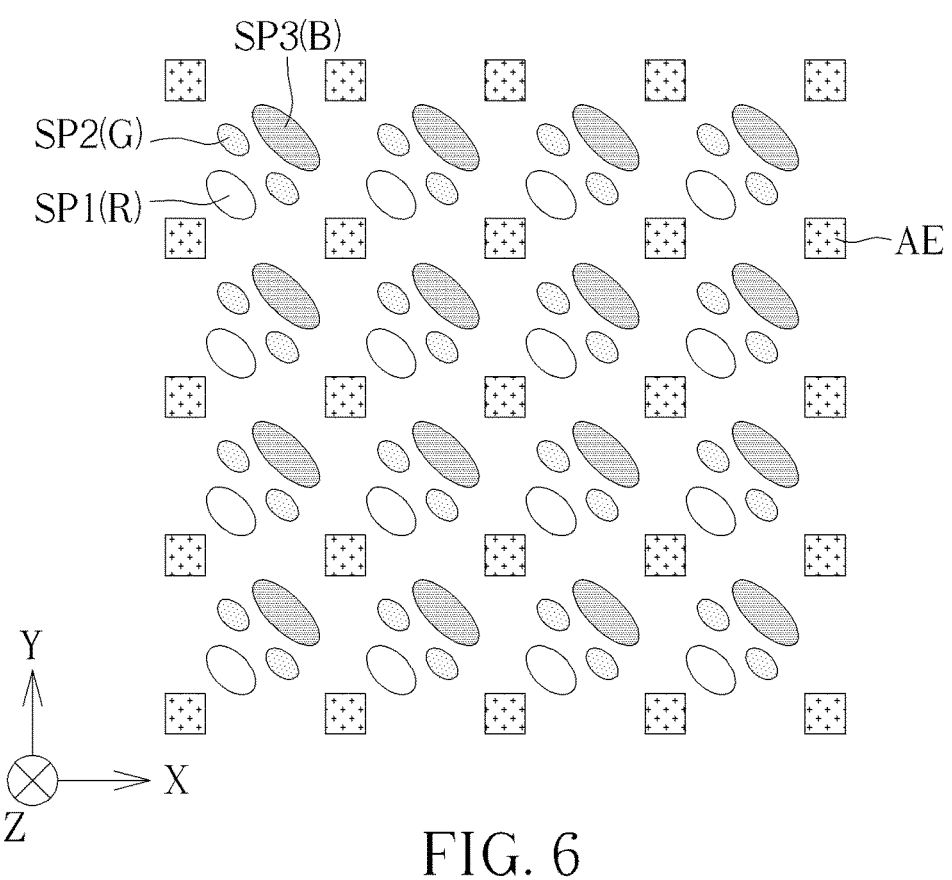
FIG. 6 is a schematic diagram showing a top view of sub-pixels and auxiliary electrodes of a display device according to another embodiment of the present disclosure.
Figure 7:
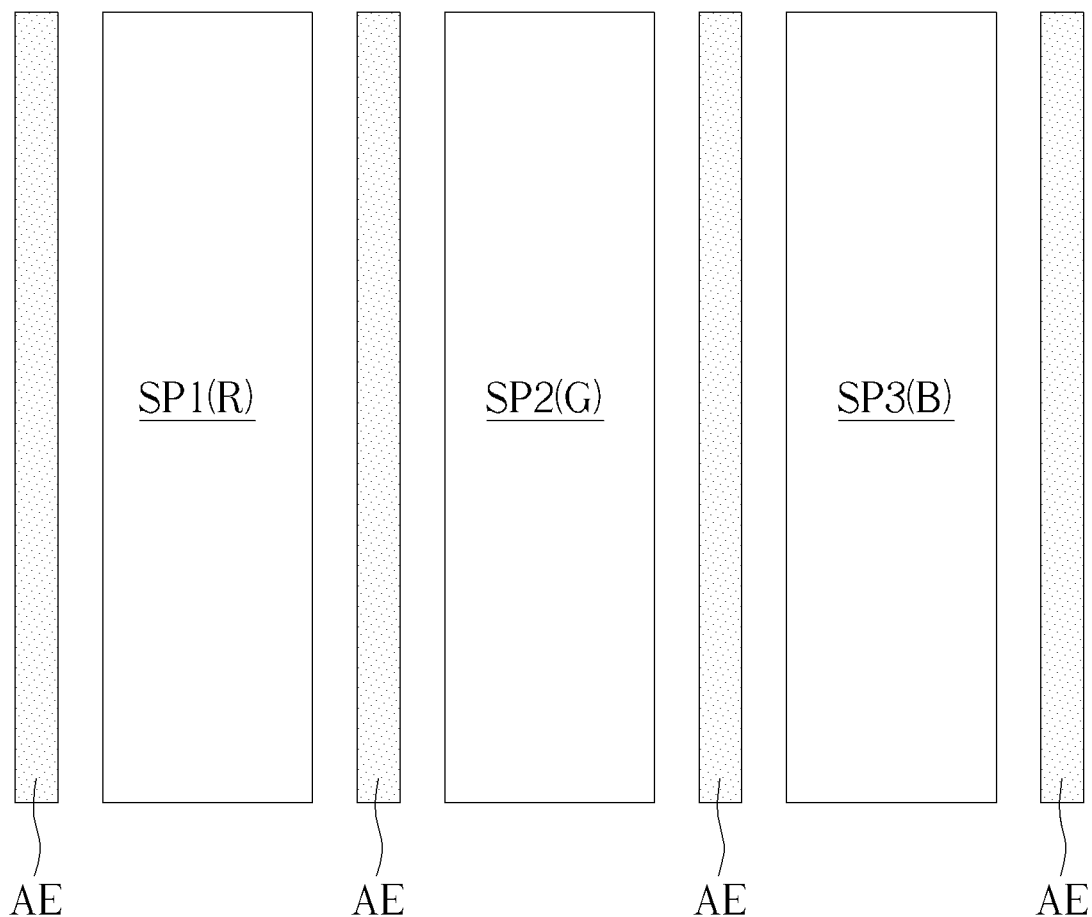
FIG. 7 is a schematic diagram showing a top view of sub-pixels and auxiliary electrodes of a display device according to another embodiment of the present disclosure.

The top view pattern of the auxiliary electrode AE is not limited by the above content, and may be designed according to the sub-pixel or any other requirement. The auxiliary electrode AE is in one of dot shape, line shape, mesh shape and any other suitable shape or a combination thereof, but not limited thereto. Referring to FIG. 5 to FIG. 6, one pixel includes one sub-pixel R, two sub-pixels G and one sub-pixel B, the sub-pixels R, G, B may be arranged in a pantile type, but not limited thereto. In FIG. 5, the pixels are arranged along the first direction X and the second direction Y to form an array, but not limited thereto. The first direction X is different from the second direction Y, and the first direction X and the second direction Y are perpendicular to the normal direction Z of the substrate 110. The auxiliary electrode AE may be in a mesh shape, and the auxiliary electrode AE may surround at least one of the pixels, but not limited thereto. In another embodiment, the auxiliary electrode AE may surround any suitable number of sub-pixel(s) or pixel(s). As shown in FIG. 6, in another embodiment, the arrangements of the sub-pixels and pixels are the same as FIG. 5, and the auxiliary electrodes AE may be in the dot shape, but not limited thereto. The corresponding relation between the auxiliary electrode(s) AE and the pixel(s) or the corresponding relation between the auxiliary electrode(s) AE and the sub-pixel(s) may be designed based on requirements. As shown in FIG. 7, the auxiliary electrode AE is in the line shape, and at least one sub-pixel may be located between two auxiliary electrodes, but not limited thereto. Moreover, in some embodiments, the display device 100 may include different shaped auxiliary electrodes AE, for example, the auxiliary electrodes AE adjacent to the peripheral pad PB disposed in the peripheral region 110b may be in the dot shape, and other auxiliary electrodes AE may be combined in the mesh shape, but not limited thereto.

Particularly, the auxiliary electrode AE may be formed by chemical vapor deposition (CVD), physical vapor deposition (PVD), imprinting process or a combination thereof, but not limited thereto. The chemical vapor deposition includes at least one of atmospheric pressure chemical vapor deposition (APCVD), low pressure chemical vapor deposition (LPCVD), aerosol assisted chemical vapor deposition (AACVD), ultra-high vacuum chemical vapor deposition (UHVCVD), direct liquid injection chemical vapor deposition (DLICVD), microwave plasma chemical vapor deposition (MPCVD), metal organic chemical vapor phase deposition (MOCVD), plasma enhanced chemical vapor deposition (PECVD), atomic layer chemical vapor deposition (ALCVD), hybrid physical-chemical vapor deposition (HPCVD), hot-wire chemical vapor deposition (HWCVD), rapid-thermal chemical vapor deposition (RTCVD) or any other chemical vapor deposition. The physical vapor deposition may include at least one of a vacuum evaporation process, a sputtering process, an ion plating process and any other physical vapor deposition. Regarding the imprinting process, a stamp is formed first, wherein the stamp may have at least one concave structure and/or at least one convex structure. The material of the stamp may be any suitable material, such as polydimethylsiloxane (PDMS). Next, in some embodiment, ink solution is spread on the convex structure of the stamp, and then, the stamp prints the ink on the conductive layer configured to form the auxiliary electrode(s) AE. In this case, the ink is served as a mask. Then, performing an etch process to remove the part(s) of the conductive layer which do(es) not overlap the ink, so as to forming the auxiliary electrode(s) AE. In another embodiment, the conductive ink may be disposed on the substrate 110, and then, the stamp is pressed on the conductive ink to imprint the conductive ink to be the auxiliary electrode AE. In another embodiment, the conductive ink may be disposed in the concave structure of the stamp and make it be cured, and then, the stamp imprints the substrate 110 with the cured conductive ink, so as to form the auxiliary electrode AE. The aforementioned imprinting processes are only examples, and any other suitable imprinting process may be used in the present disclosure.

In some embodiments, in FIG. 2, an array substrate structure and an opposite substrate structure are included in the display device 100, wherein the array substrate structure is formed on the substrate 110, and the opposite substrate structure is formed on the opposite substrate 160. In some embodiments, the array substrate structure may include the circuit layer structure CL, the light emitting units LU, the pixel defining layer PDL and the auxiliary electrode AE, but not limited thereto. In some embodiments, the opposite substrate structure may include the light conversion layers 170 and the light shielding layer 180, but not limited thereto. In some embodiment, the array substrate structure may include a protecting layer 140 and a first flattening layer 150, the protecting layer 140 may be disposed on the light emitting units LU and/or the auxiliary electrode AE for protecting the components and/or structures below the protecting layer 140, and the first flattening layer 150 is disposed on the protecting layer 140 for flattening the surface of the array substrate structure, but not limited thereto. The opposite substrate structure may include a second flattening layer 190, the light conversion layers 170 and the light shielding layer 180 may disposed between the second flattening layer 190 and the opposite substrate 160, and the second flattening layer 190 may be disposed to flatten the surface of the opposite substrate structure. The material of the protecting layer 140, the first flattening layer 150 and the second flattening layer 190 may individually include any suitable insulating material, and the material of the protecting layer 140 may include at least one inorganic insulating layer and/or at least one organic insulating layer, but not limited thereto. For example, the material of the first flattening layer 150 and the material of the second flattening layer 190 may have the same refractive index or similar refractive indexes (such as 1.3-1.6). In some embodiment, a different of the refractive index of the first flattening layer 150 and the refractive index of the second flattening layer 190 may be in a range between 0 to 0.3 ($0 \leq \Delta n \leq 0.3$), but not limited thereto. In some embodiment, the protecting layer 140 may be a single-layer structure or multi-layer structure, and the protecting layer 140 may include at least one inorganic insulating layer and/or at least one organic insulating layer, for example, the protecting layer 140 may include two inorganic insulating layers and one organic insulating layer disposed between two inorganic insulating layers, but not limited thereto. In another embodiment, the first flattening layer 150 and the material of the second flattening layer 190 may include at least one inorganic insulating layer and/or at least one organic insulating layer. In some embodiment, the opposite substrate structure may further include a bragg layer GL disposed adjacent to the light conversion layer 170, and the bragg layer GL is disposed between the light conversion layer 170 and the light emitting units LU. In some embodiments, the bragg layer GL may be disposed between the light conversion layer 170 and the second flattening layer 190, wherein the reflective light caused by the light conversion layer 170 and/or the scattering layer 176 may be hard to pass through the bragg layer GL, such that the utilization of the light is increased. In some embodiments, the bragg layer GL may penetrate lights with some wavelengths, and reflect lights with other wavelengths. For example, the bragg layer GL may penetrate the blue light, and the bragg layer GL may reflect light with other color. In some embodiment, the opposite substrate structure may further includes an optical layer OL disposed on the opposite substrate 160, and the optical layer OL may include polarizer, anti-reflection layer, anti-glare layer, light diffusion layer, privacy protection layer, privacy filter, anti-peep layer or scratch resistant layer, but not limited thereto. Apart from the above, the display device 100 may further include any other suitable layer or component.

The assembling process of the substrate 110 with the array substrate structure and the opposite substrate 160 with the opposite substrate structure may be any suitable method. In some embodiments, the substrate 110 with the array substrate structure and the opposite substrate 160 with the opposite substrate structure may be assembled by a sealant disposed in the peripheral region 110b, and an air gap AG may exist between the array substrate structure and the opposite substrate structure, but not limited thereto. If the air gap AG exists between the first flattening layer 150 and the second flattening layer 190, when the light emitted from the light emitting unit LU passes through the first flattening layer 150, the air gap AG and the second flattening layer 190 in sequence, the path of the light may be adjusted according to the second flattening layer 190 and air gap AG. For example, the path of the light may be adjusted according to the different of the refractive indexes of the air and the second flattening layer 190, such as the scattering rate (or angle) of the light, the reflecting (or angle) of the light and/or the refracting (or angle) of the light may be adjusted. In some embodiments, the display device 100 has at least one protrusion structure disposed between the opposite substrate 160 and the auxiliary electrode AE, wherein the protrusion structure may be corresponding to or overlapped with the auxiliary electrode AE in the top view direction Z of the display device. In some embodiments, the first flattening layer 150 includes the protrusion structure PS1. In some embodiments, the protrusion structure PS2 is included in the opposite substrate structure, for example, the second flattening layer 190 includes the protrusion structure PS2. The protrusion structures PS1, PS2 may be disposed to release the stress or mitigate the deformation of the display device 100. In another embodiment, the protrusion structures PS1, PS2 may be served as spacers, but not limited thereto.

The display device of the present disclosure is not limited to the above embodiments. Further embodiments of the present disclosure are described below. For ease of comparison, same components will be labeled with the same symbol in the following. The following descriptions relate the differences between each of the embodiments, and repeated parts will not be redundantly described. Note that, FIG. 8 to FIG. 15 only show the first sub-pixel SP1 and the second sub-pixel SP2 and omit the optical layer OL, and the light shielding structure BM is a single-layer structure to make the figures simple and clear. In some embodiment, an overcoat layer is disposed between the array substrate structure and the opposite substrate structure (e.g. between the first flattening layer 150 and the second flattening layer 190) to protect the components and/or structures in the display device. In some embodiments, the overcoat layer may have an adhesive property, the array substrate structure and the opposite substrate structure may be assembled more rigidly.

Figure 8:
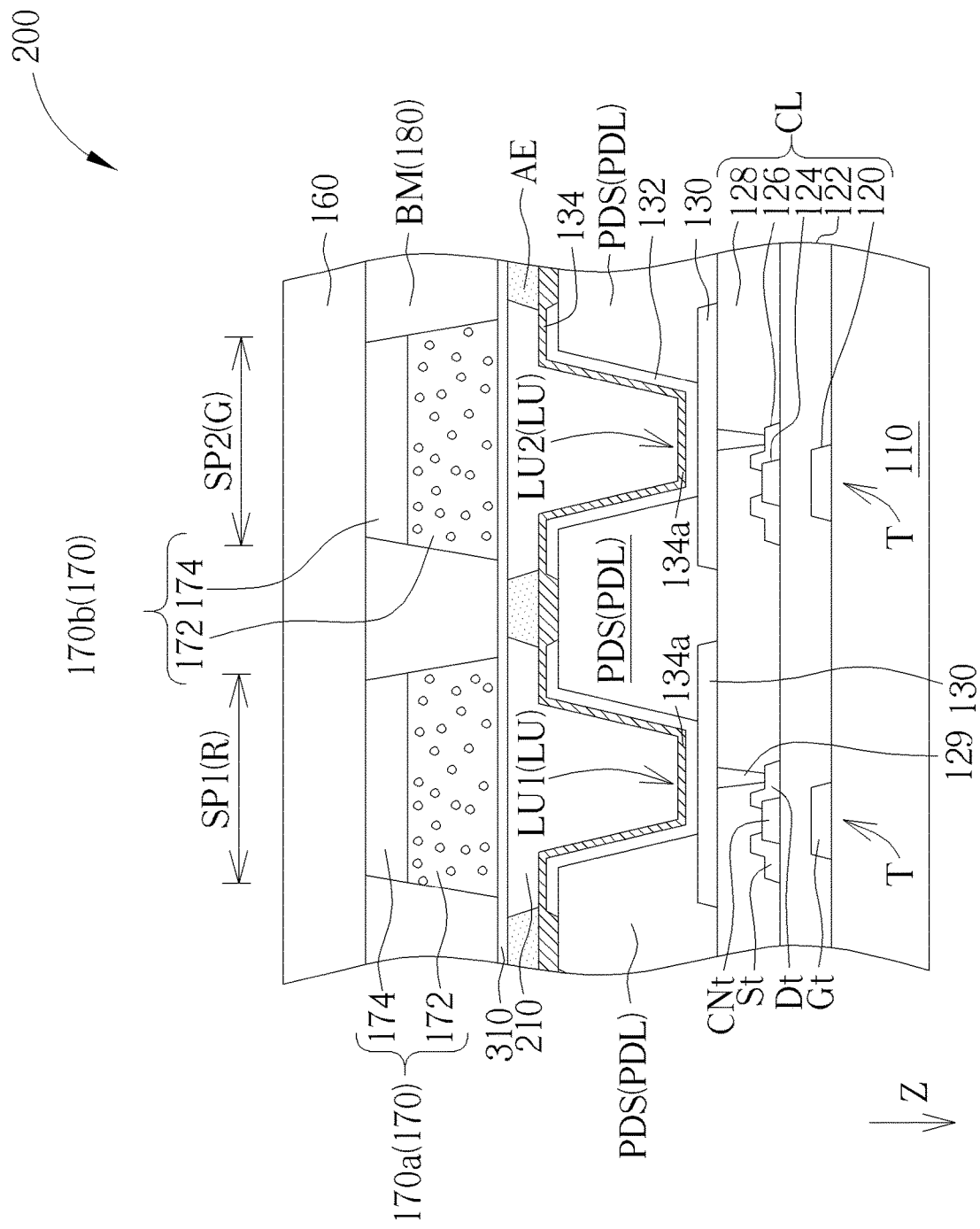
FIG. 8 is a schematic diagram showing a cross-sectional view of a display device according to a second embodiment of the present disclosure.

Referring to FIG. 8, FIG. 8 is a schematic diagram showing a cross-sectional view of a display device according to a second embodiment of the present disclosure. As shown in FIG. 8, the difference between the first embodiment and second embodiment is that the auxiliary electrode AE of the display device 200 is disposed on the second electrode layer 134. In FIG. 8, the bottom surface of the auxiliary electrode AE is in contact with the second electrode layer 134, but not limited thereto. In FIG. 8, the display device 200 does not include the protecting layer 140, the first flattening layer 150 and/or the second flattening layer 190. The display device 200 uses the overcoat layer 210 to protect the components and structures of the display device 200. In FIG. 8, the auxiliary electrode AE may be served as a spacer between the array substrate structure and the opposite substrate structure, and the auxiliary electrode AE may include organic materials, conductive materials (such as conductive particles), but not limited thereto. In some embodiments, the opposite substrate structure may further include a transparent conductive layer 310, the transparent conductive layer 310 is disposed between the light shielding layer 180 and the auxiliary electrode AE, and the auxiliary electrode AE is electrically connected with the transparent conductive layer 310. In some embodiments, the auxiliary electrode AE may be in contact with the transparent conductive layer 310. In some embodiments, the signal (e.g. the common voltage) may pass through the peripheral wire PW, the peripheral pad PB, the transparent conductive layer 310, the auxiliary electrode AE to the second electrode layer 134 in sequence, but not limited thereto. In some embodiments, the transparent conductive layer 310 may increase the electrical property (or reduce the resistance) of the second electrode layer 134 (such as common cathode electrode). In some embodiments (FIG. 2 and FIG. 8), the light emitting layer 132 may be a continuously layer corresponding to different light emitting units LU. In some embodiments (not shown), the light emitting layer 132 may include a single layer or a multi-layer. In some embodiments (not shown), the light emitting layer 132 may include the multi-layer, and part of the multi-layer may be continuously layer corresponding to different the light emitting units LU, and part of the multi-layer may be separated. In some embodiments (not shown), the light emitting layer 132 may include the multi-layer, and the layers of the multi-layer may be continuously layers corresponding to different the light emitting units LU. In some embodiments (not shown), the light emitting layer 132 may include the multi-layer, and the layers of the multi-layer may be separated. Furthermore, in FIG. 8, an overcoat layer 210 is disposed between the light emitting units LU and the transparent conductive layer 310, but not limited thereto.

Figure 9:
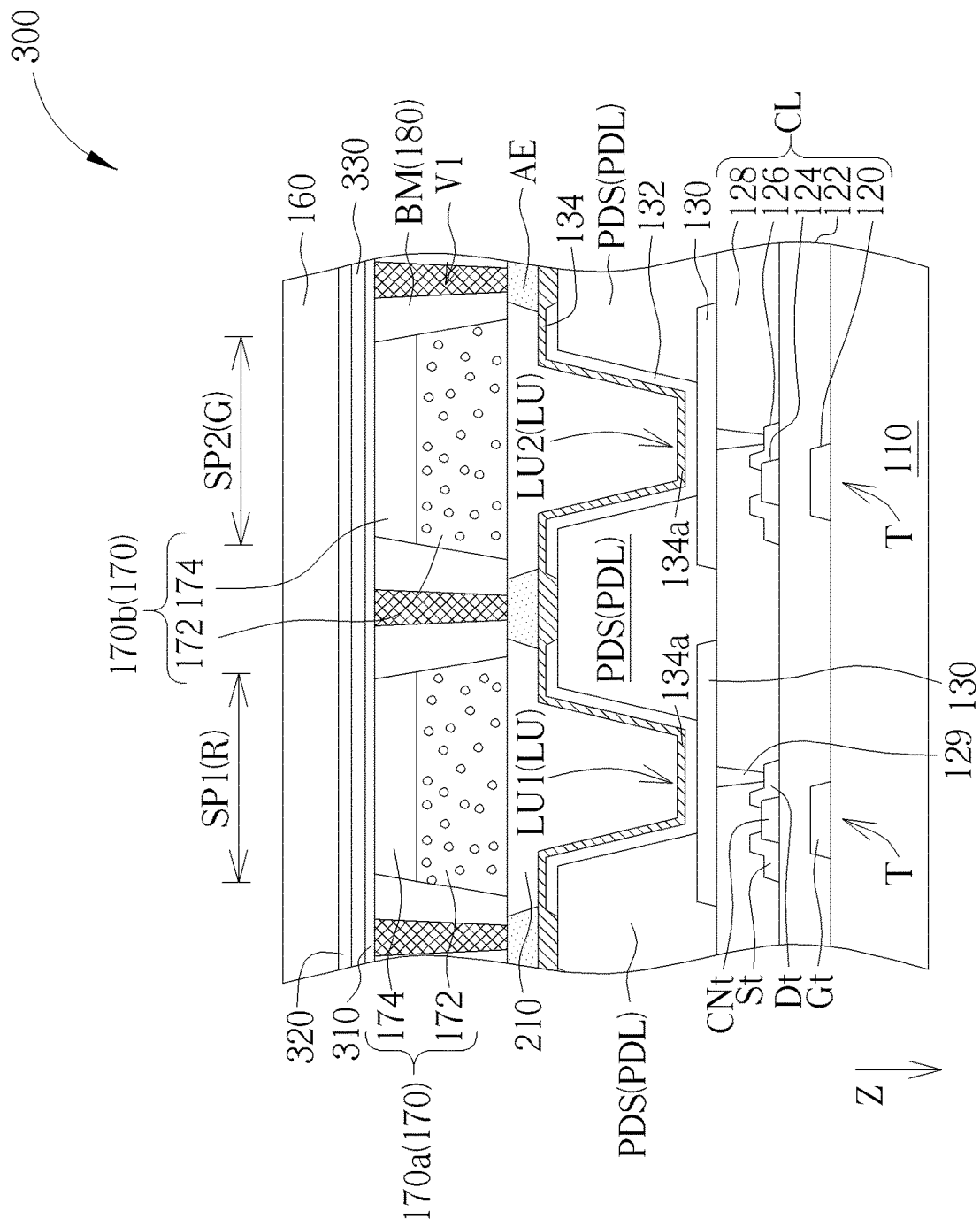
FIG. 9 is a schematic diagram showing a cross-sectional view of a display device according to a third embodiment of the present disclosure.

Referring to FIG. 9 is a schematic diagram showing a cross-sectional view of a display device according to a third embodiment of the present disclosure. As shown in FIG. 9, the difference between the second embodiment and third embodiment is that the transparent conductive layer 310 of the display device 300 is disposed between the opposite substrate 160 and the light shielding layer 180, and the second electrode layer 134 may be electrically connected with the auxiliary electrode AE through at least one conductive via V1 disposed in the light shielding layer 180. It should be noted that the conductive via V1 may be a via filled conductive materials. The transparent conductive layer 310 may be served as a touch layer. For example, the transparent conductive layer 310 may be served as one of a receiving electrode layer and transferring electrode layer, a transparent conductive layer 320 may disposed on the transparent conductive layer 310, and the transparent conductive layer 320 may be served as another one of the receiving electrode layer and the transferring electrode layer, and at least one insulating layer 330 is disposed between the transparent conductive layer 310 and the transparent conductive layer 320, but not limited thereto. In some embodiments, the top view pattern of the transparent conductive layer 310 and the transparent conductive layer 320 may include metal mesh pattern, but not limited thereto. In some embodiments, the conductive via V1 include metal materials, which can be used for reducing the interference of the lights emitting from different light emitting units LU, or increase the conversion efficiency of light.

Figure 10:
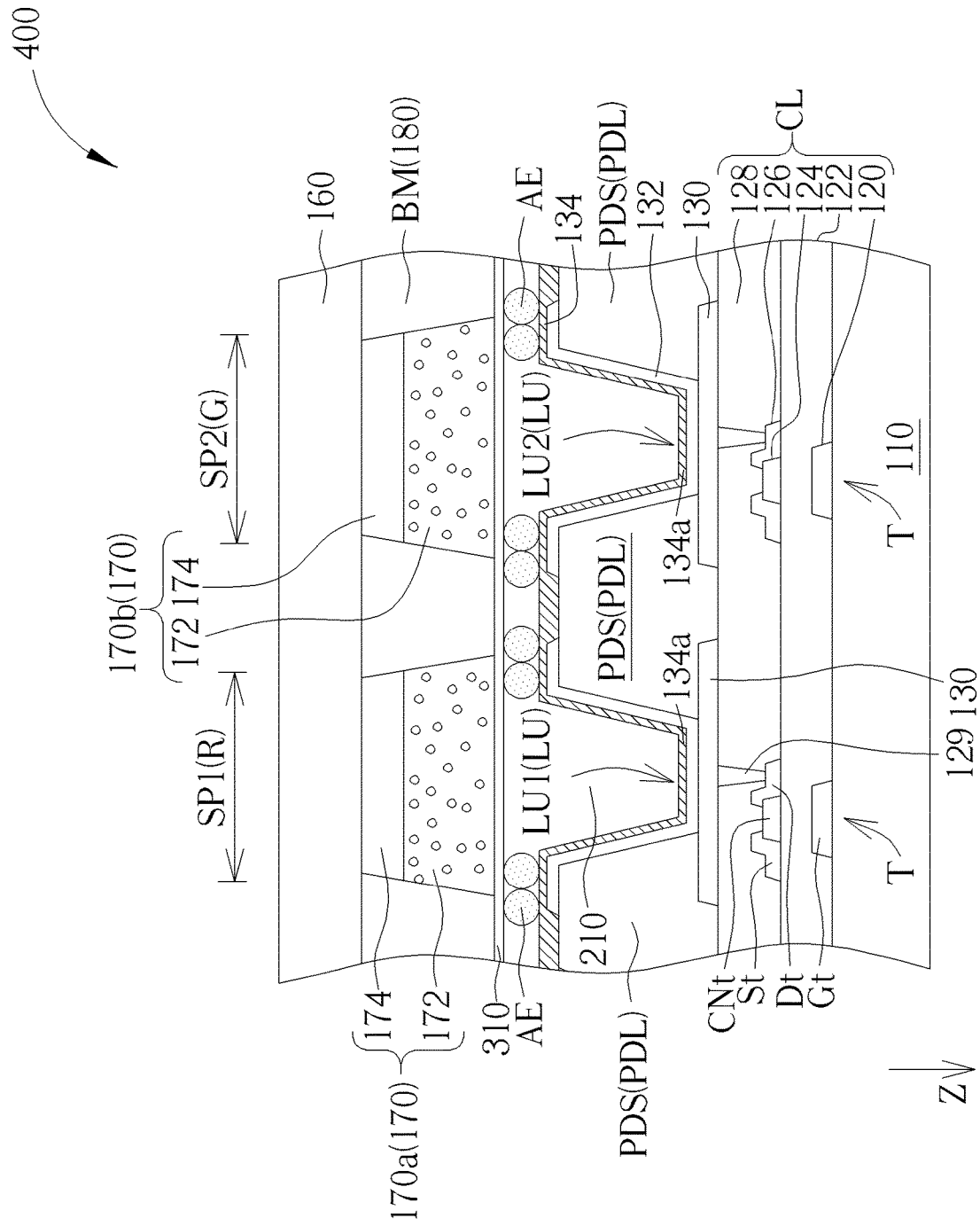
FIG. 10 is a schematic diagram showing a cross-sectional view of a display device according to a fourth embodiment of the present disclosure.

Referring to FIG. 10, FIG. 10 is a schematic diagram showing a cross-sectional view of a display device according to a fourth embodiment. As shown in FIG. 10, the difference between the second embodiment and fourth embodiment is that one pixel defining structure PDS of the display device 400 is corresponding to a plurality of auxiliary electrodes AE; in FIG. 10, part of pixel defining structure PDS may be overlapped with at least one auxiliary electrodes AE (such as four auxiliary electrodes AE) in the top view direction Z of the display device, but not limited thereto. In some embodiments, the cross-sectional profile of the auxiliary electrode AE may include the circle. In some embodiments, the auxiliary electrode AE may be in a spherical shape, and the auxiliary electrode AE may be a conductive elastomer, such as an elastomer body coated with conductive material, but not limited thereto. Since the auxiliary electrode AE is the conductive elastomer, the distance between the array substrate structure and the opposite substrate structure may be adjusted when assembling. On the other hands, the auxiliary electrode AE may be formed after the light conversion layers 170. For example, after forming the second electrode layer 134 of the array substrate structure and forming the light conversion layers 170 (or the transparent conductive layer 310) of the opposite substrate structure, the auxiliary electrode AE served as the spacer may be formed between the array substrate structure and the opposite substrate structure in assembling process, but not limited thereto. The second electrode layer 134 may be electrically connected with the transparent conductive layer 310 through the auxiliary electrode AE, and the signal (e.g. the common voltage) may pass through the peripheral wire PW, the peripheral pad PB, the transparent conductive layer 310, the auxiliary electrode AE to the second electrode layer 134 in sequence, but not limited thereto.

Figure 11:
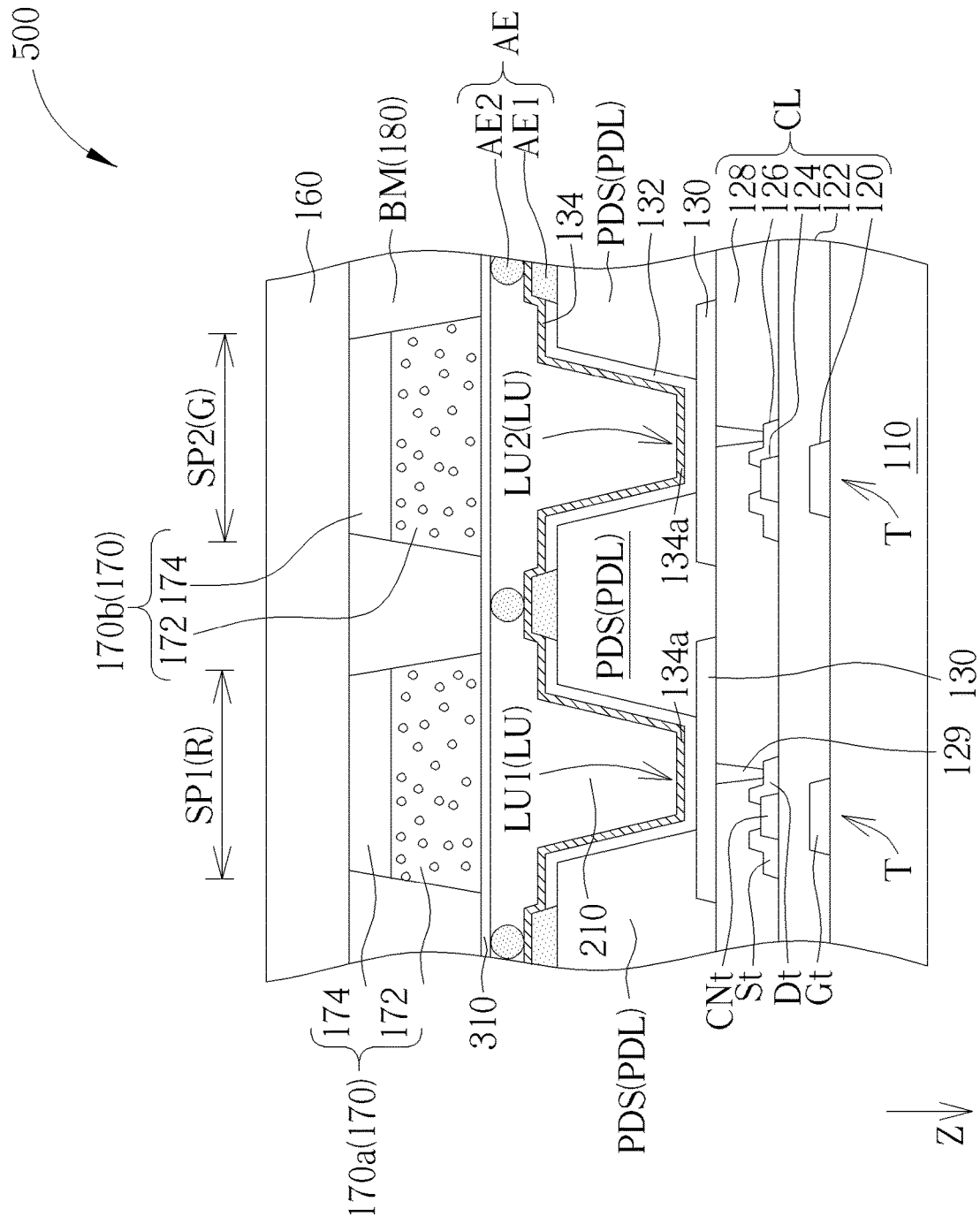
FIG. 11 is a schematic diagram showing a cross-sectional view of a display device according to a fifth embodiment of the present disclosure.

Referring to FIG. 11, FIG. 11 is a schematic diagram showing a cross-sectional view of a display device according to a fifth embodiment. As shown in FIG. 11, the difference between the second embodiment and fifth embodiment is that the auxiliary electrode AE of the display device 500 may include a first auxiliary part AE1 and a second auxiliary part AE2, and the second electrode layer 134 is disposed between the first auxiliary part AE1 and the second auxiliary part AE2. In some embodiments, the cross-sectional profiles of the first auxiliary part AE1 and the second auxiliary part AE2 may be the same or different. For instance, in FIG. 11, the cross-sectional profile of the first auxiliary part AE1 disposed on the second electrode layer 134 may be the circle, or spherical shape. The cross-sectional profile of the second auxiliary part AE2 disposed below the second electrode layer 134 may be the trapezoid, but not limited thereto. In addition, the first auxiliary part AE1 may be a conductive elastomer, but not limited thereto.

Figure 12:
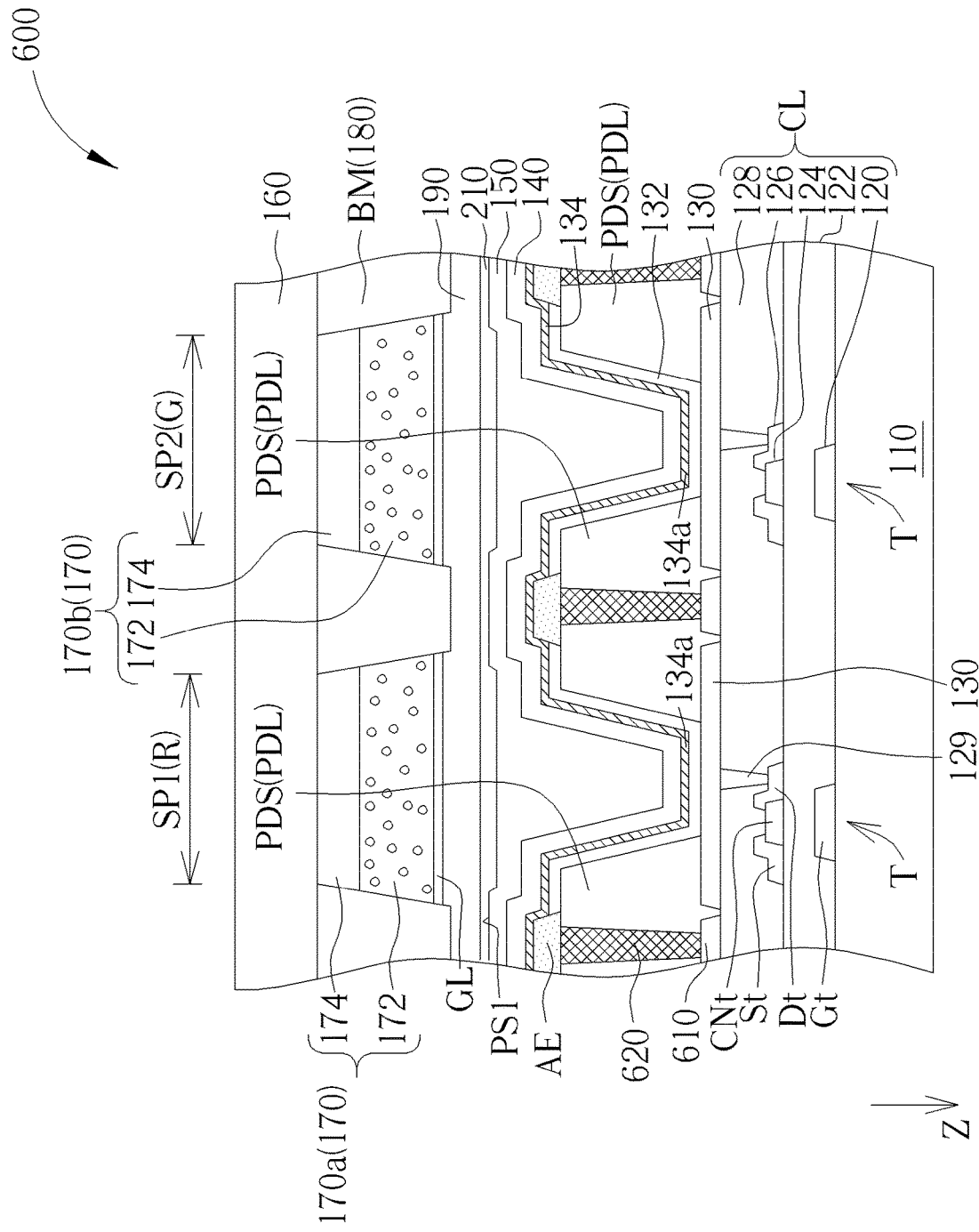
FIG. 12 is a schematic diagram showing a cross-sectional view of a display device according to a sixth embodiment of the present disclosure.

Referring to FIG. 12, FIG. 12 is a schematic diagram showing a cross-sectional view of a display device according to a sixth embodiment. As shown in FIG. 12, the difference between the first embodiment and sixth embodiment is that the display device 600 further includes a conductive via 620 and a common electrode 610 electrically connected with the auxiliary electrode AE. In this embodiment (FIG. 12), the common electrode 610 is disposed between the pixel defining layer PDL and the substrate 110, and the conductive via 620 passes through the pixel defining layer PDL and is electrically connected with the auxiliary electrode AE and the common electrode 610, but not limited thereto. The material of the common electrode 610 may be any suitable conductive material, and the position of the common electrode 610 may be designed based on requirements. For example, in FIG. 12, the common electrode 610 and the first electrode 130 are formed of the same layer. In some embodiments, the material of the common electrode 610 may be the same as the material of the auxiliary electrode AE. In some embodiments, the common electrode 610 may be formed of at least one of the conductive layer of the circuit layer structure CL, such as the first conductive layer 120 or the second conductive layer 126. In some embodiments, the common electrode 610 may be formed of the other conductive layer, which is different from the circuit layer structure CL. In some embodiments, the common electrode 610 may be multi-layer. Note that, the common electrode 610 may be overlapped with the light shielding layer 180 in the top view direction Z, and the common electrode 610 may be shielded by the light shielding layer 180. In some embodiments, the common electrode 610 may be served as a portion of the capacitor. In some embodiments, two common electrodes 610 may have different widths, different thicknesses, different lengths and/or different surrounding areas, and/or two common electrodes 610 may be formed of different layers or materials.

In some embodiments, the material of the conductive via 620 may include metal, and the conductive via 620 may be served as a partition wall to mitigate the influence between the light of different sub-pixels. In another embodiment (not shown), the conductive via 620 may have a plurality of parts electrically connected to each other, and these parts may be formed as stairs type, but not limited thereto. Regarding the forming process of the conductive via 620, a through hole is formed by any suitable process, such as photolithography or laser etching, and the conductive material can be formed in the through hole by a deposition process to form the conductive via 620, but not limited thereto. In some embodiments, the signal (e.g. the common voltage) may pass through the peripheral wire PW, the peripheral pad PB, the auxiliary electrode AE and the conductive via 620 to the common electrode 610 in sequence, but not limited thereto. In some embodiments (not shown), the signal may pass through the peripheral wire PW, the common electrode 610 and the conductive via 620 to the auxiliary electrode AE in sequence, but not limited thereto. In some embodiments (shown in FIG. 12), the side surface of the auxiliary electrode AE is in contact with the light emitting layer 132, but not limited thereto. Furthermore, in FIG. 12, an overcoat layer 210 is disposed between the first flattening layer 150 and the second flattening layer 190, but not limited thereto.

Figure 13:
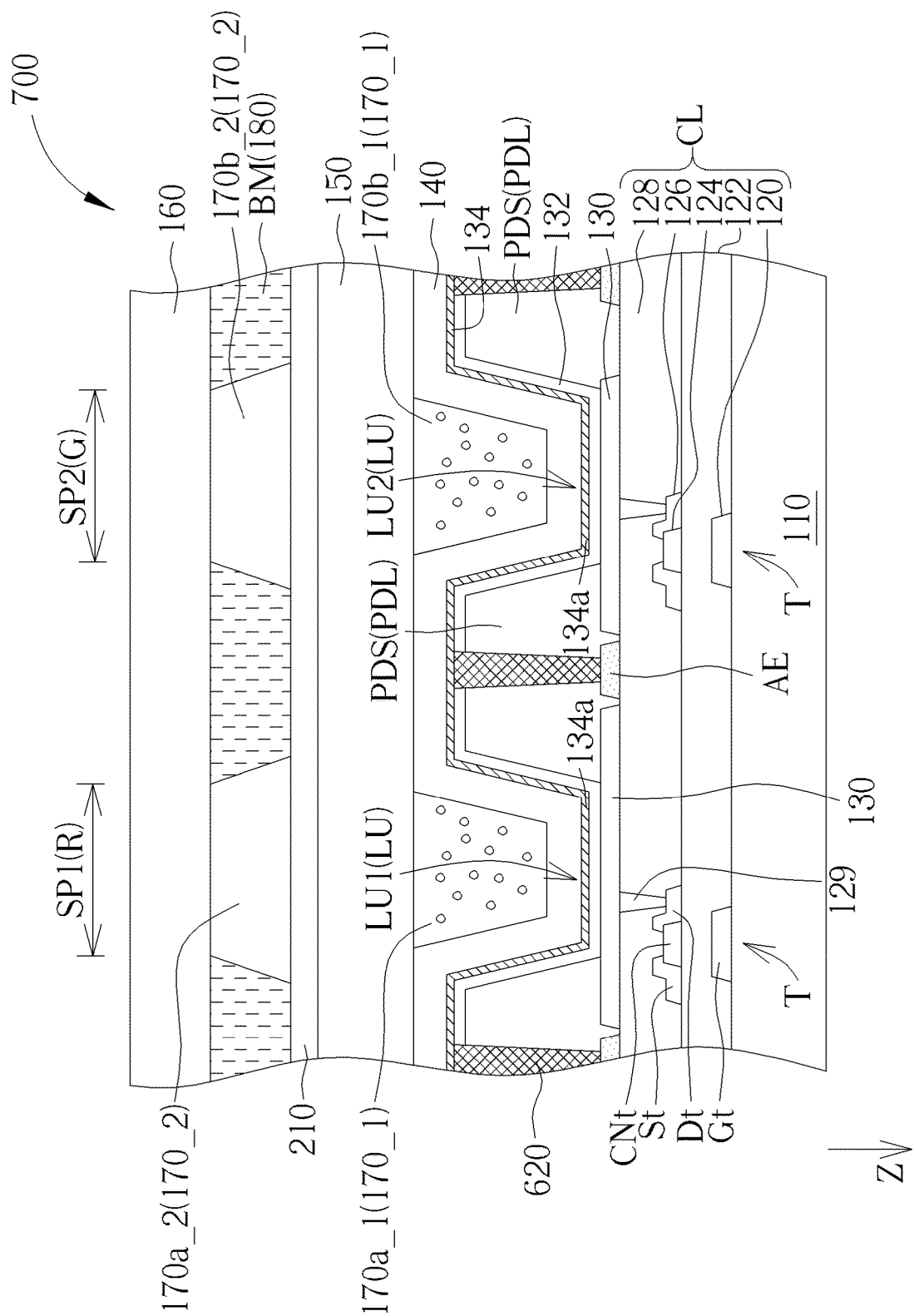
FIG. 13 is a schematic diagram showing a cross-sectional view of a display device according to a seventh embodiment of the present disclosure.

Referring to FIG. 13, FIG. 13 is a schematic diagram showing a cross-sectional view of a display device according to a seventh embodiment. As shown in FIG. 13, the difference between the first embodiment and seventh embodiment is that the auxiliary electrode AE of the display device 700 is disposed between the pixel defining layer PDL and the substrate 110. In some embodiment (FIG. 13), the auxiliary electrode AE of the display device 700 is disposed below the pixel defining layer PDL. In some embodiment (FIG. 13), the display device 700 further includes a conductive via 620 disposed to be electrically connected with the auxiliary electrode AE and the second electrode layer 134. In some embodiment (FIG. 13), the auxiliary electrode AE and the first electrode 130 are formed of the same layer, and the conductive via 620 passes through the pixel defining layer PDL and the light emitting layer 132, but not limited thereto. In some embodiments (not shown), the auxiliary electrode AE is disposed between the circuit layer structure CL and the pixel defining layer PDL, and the material of the auxiliary electrode AE may be different from the first electrode 130. The detail of the conductive via 620 is described in the sixth embodiment, and will not be redundantly described.

Referring to FIG. 13, the light conversion layers 170_1 are included in the array substrate structure, and the light conversion layers 170_2 are included in the opposite substrate structure, wherein the light conversion layers 170_1 include the first light conversion layer 170a_1 and the second light conversion layer 170b_1, and light conversion layers 170_2 include the first light conversion layer 170a_2 and the second light conversion layer 170b_2. For example, the light conversion layer 170_1 includes quantum dots (or phosphors), and the light conversion layer 170_2 includes color filter, the light conversion layer 170_2 is similar to the second conversion part 174 of the light conversion layer 170 of the first embodiment. In this embodiment, the light conversion layer 170_1 are disposed between two pixel defining structures PDS in the top view direction Z. In this embodiment, the light conversion layer 170_1 is disposed between the protecting layer 140 and the first flattening layer 150, but not limited thereto. In some embodiments, the protecting layer 140 may include at least one inorganic insulating layer and/or at least one organic insulating layer, and the first flattening layer 150 may include at least one inorganic insulating layer and/or at least one organic insulating layer to protect the light conversion layers 170_1. In some embodiment, the number of the layers included in the first flattening layer 150 may be less than the number of the layers included in the protecting layer 140, but not limited thereto. In some embodiment, the thickness of the first flattening layer 150 may be greater than thickness of the protecting layer 140, but not limited thereto.

In some embodiments, the display device 700 may include the light conversion layers 170_1 in the array substrate structure, but not include the light conversion layers 170_2 in the opposite substrate structure. In other embodiments (not shown), the auxiliary electrode AE may be formed after forming the light conversion layers 170_1.

Figure 14:
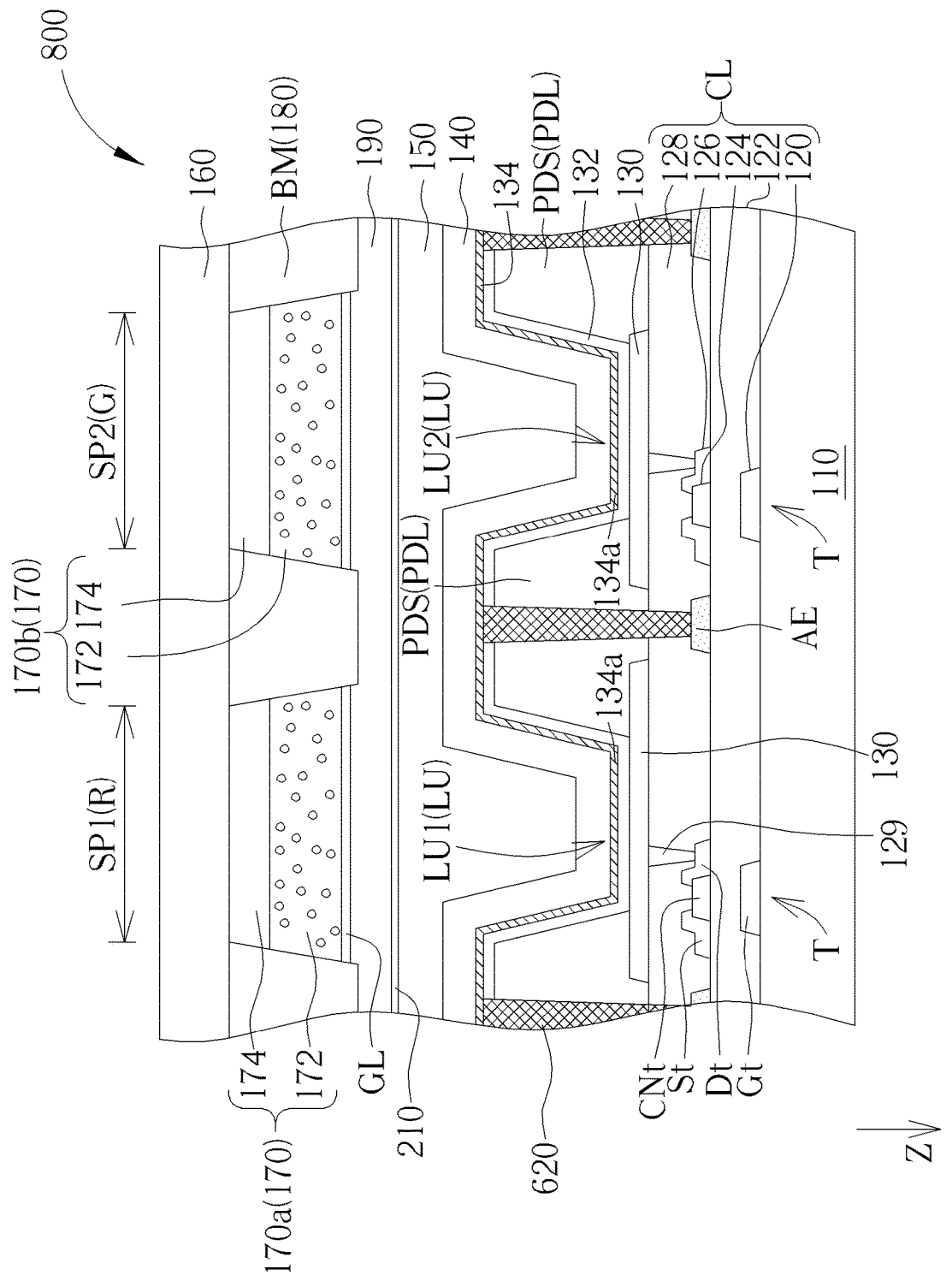
FIG. 14 is a schematic diagram showing a cross-sectional view of a display device according to an eighth embodiment of the present disclosure.

Referring to FIG. 14, FIG. 14 is a schematic diagram showing a cross-sectional view of a display device according to an eighth embodiment. As shown in FIG. 14, the difference between the seventh embodiment and eighth embodiment is that the auxiliary electrode AE of the display device 800 is included in the circuit layer structure CL. In FIG. 14, the auxiliary electrode AE is formed of the second conductive layer 126 of the circuit layer structure CL, but not limited thereto. In another embodiment (not shown), the auxiliary electrode AE is formed of the first conductive layer 120.

Figure 15:
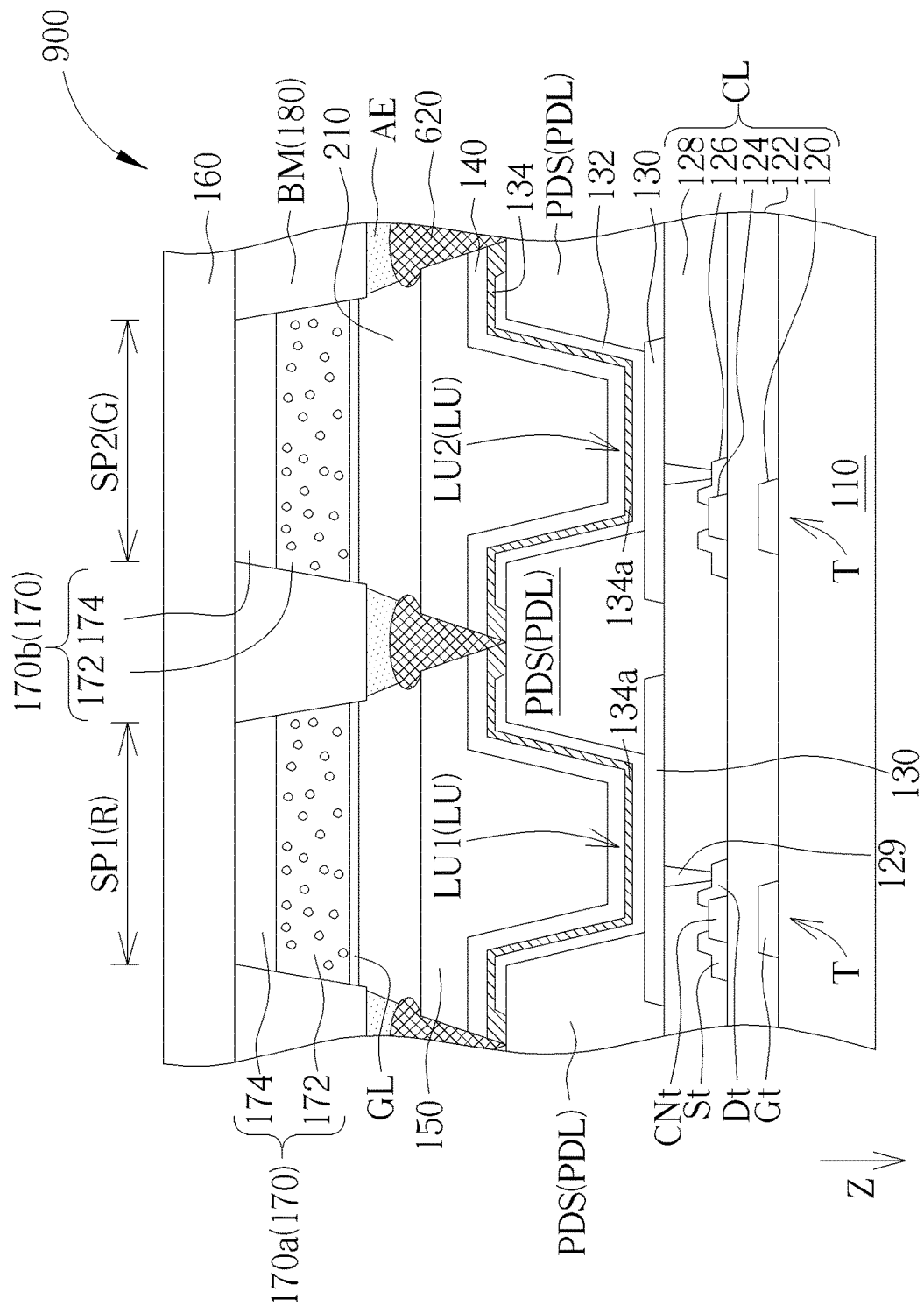
FIG. 15 is a schematic diagram showing a cross-sectional view of a display device according to a ninth embodiment of the present disclosure.

Referring to FIG. 15, FIG. 15 is a schematic diagram showing a cross-sectional view of a display device according to a ninth embodiment. As shown in FIG. 15, the difference between the first embodiment and ninth embodiment is that the auxiliary electrode AE of the display device 900 is disposed on the second electrode layer 134. In this embodiment, the auxiliary electrode AE is disposed on the protecting layer 140 and/or the first flattening layer 150, and a conductive via 620 passes through the protecting layer 140 and/or the first flattening layer 150, and the conductive via 620 may be electrically connected with the auxiliary electrode AE and the second electrode layer 134. Note that, the detail of the conductive via 620 is described in the sixth embodiment, and will not be redundantly described. In some embodiment, the auxiliary electrode AE is in contact with the light shielding layer 180 and/or the conductive via 620, and the conductive via 620 is in contact with the second electrode layer 134, but not limited thereto. In this embodiment, the auxiliary electrode AE is formed on the opposite substrate 160, but not limited thereto.

In some embodiments, the auxiliary electrode AE is formed on the substrate 110 and disposed on the conductive via 620 (that is, the auxiliary electrode AE belongs the array substrate structure). In FIG. 15, the auxiliary electrode AE may be served as a spacer. In some embodiments, the overcoat layer 210 is formed or disposed between the array substrate structure and the opposite substrate structure, and the auxiliary electrode AE is in contact with the overcoat layer 210, but not limited thereto. In some embodiments, an air gap may exist between the array substrate structure and the opposite substrate structure, but not limited thereto. In some embodiments (not shown), the light shielding structures BM may be replace by the auxiliary electrode AE, and the auxiliary electrode AE may include any suitable conductive materials, such as poly(3,4-ethylenedioxythiophene)-poly(styrenesulfonate) (PEDOT/PSS), but not limited thereto, and the conductive via 620 may be electrically connected between the auxiliary electrode AE and the second electrode layer 134.

In some embodiment (not shown), the auxiliary electrode AE of the display device is embedded in the pixel defining layer PDL. More specifically, the pixel defining layer PDL may have at least one recess, and the auxiliary electrode AE may be disposed in the recess. In some embodiment (not shown), the top surface of the auxiliary electrode AE and the top surface of the pixel defining layer PDL are formed as a planar surface. In some embodiment (not shown), the top surface of the auxiliary electrode AE and the top surface of the pixel defining layer PDL are aligned. In some embodiment (not shown), the top surface of the auxiliary electrode AE and the top surface of the pixel defining layer PDL are not aligned. In some embodiment (not shown), the auxiliary electrode AE may be disposed in the recess of the pixel defining layer PDL, and the auxiliary electrode AE may cover part of the top surface of the pixel defining layer PDL.

In some embodiment (not shown), the light conversion layers 170 are not included in the display device, the different light emitting units LU (such as the first light emitting unit LU1, the second light emitting unit LU2 and the third light emitting unit LU3) may emit different color light (such as red light, green light and/or blue light, but not limited thereto). In some embodiments, the light conversion layers may be disposed on the substrate 110 or the opposite substrate 160.

In the present disclosure, the above embodiments are exemplarily described, but the present disclosure does not limited by these embodiments. The features described in the above embodiments may be selected and combined to be another embodiment.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device having a display region and a peripheral region, comprising:
   a cathode electrode;
   a first anode electrode and a second anode electrode;
   a first light emitting layer disposed between the cathode electrode and the first anode electrode;
   a first light conversion layer disposed above the first light emitting layer;
   a second light emitting layer disposed between the cathode electrode and the second anode electrode;
   a second light conversion layer disposed above the second light emitting layer;
   an auxiliary electrode electrically connected to the cathode electrode;
   a peripheral pad disposed in the peripheral region; and
   a peripheral wire disposed in the peripheral region;
   wherein a portion of the auxiliary electrode is between the first light conversion layer and the second light conversion layer in a top view direction of the display device;
   wherein the peripheral pad is electrically connected with the peripheral wire and the auxiliary electrode, and the peripheral pad is electrically connected with the auxiliary electrode through a plurality of connection regions.

2. The display device according to claim 1, wherein the first light conversion layer is surrounded by the auxiliary electrode in the top view direction of the display device.

3. The display device according to claim 1, wherein the auxiliary electrode is in one of dot shape, line shape and mesh shape.

4. The display device according to claim 1, wherein a minimum distance between the auxiliary electrode and the first light conversion layer in the top view direction of the display device is greater than or equal to 0.5 µm and less than or equal to 10 µm.

5. The display device according to claim 1, wherein the auxiliary electrode is formed after the first light conversion layer and the second light conversion layer.

6. The display device according to claim 1, further comprising a light shielding layer disposed between the first light conversion layer and the second light conversion layer in the top view direction of the display device, wherein a ratio of a minimum distance between an outline of a projected area of the light shielding layer on a substrate and an outline of a projected area of the auxiliary electrode on the substrate in the top view direction of the display device to a width of the auxiliary electrode is greater than or equal to 0.06 and less than or equal to 1.4.

7. The display device according to claim 1, further comprising:
   a protecting layer disposed between the cathode electrode and the auxiliary electrode; and
   a conductive via passing through the protecting layer and electrically connected with the auxiliary electrode and the cathode electrode.

8. The display device according to claim 1, wherein a side surface of the auxiliary electrode is in contact with the first light emitting layer.

9. The display device according to claim 1, further comprising:
   an opposite substrate disposed on the first light emitting layer and the second light emitting layer; and
   a protrusion structure disposed between the opposite substrate and the auxiliary electrode.

10. The display device according to claim 1, further comprising:
    a substrate, wherein the first light emitting layer and the second light emitting layer are disposed on the substrate;
    a pixel defining layer disposed on the substrate and disposed between the first light emitting layer and the second light emitting layer; and
    a conductive via passing through the pixel defining layer and electrically connected with the auxiliary electrode.

11. The display device according to claim 10, further comprising a common electrode disposed between the pixel defining layer and the substrate, wherein the conductive via is electrically connected with the auxiliary electrode and the common electrode.

12. The display device according to claim 11, further comprising a circuit layer structure, and the common electrode is formed of a conductive layer in the circuit layer structure.

13. The display device according to claim 1, wherein a thickness of the auxiliary electrode is greater than a thickness of the cathode electrode.

14. The display device according to claim 1, wherein the auxiliary electrode is a conductive elastomer.

15. The display device according to claim 1, wherein the auxiliary electrode has a first auxiliary part and a second auxiliary part, and the cathode electrode is disposed between the first auxiliary part and the second auxiliary part.

16. The display device according to claim 1, wherein the auxiliary electrode is disposed between the cathode electrode and the first light emitting layer.

17. The display device according to claim 1, wherein a width of the auxiliary electrode is greater as a distance between the auxiliary electrode and the peripheral pad is increased.

18. A display device having a display region and a peripheral region, comprising:
    a first light emitting unit;
    a second light emitting unit disposed adjacent to the first light emitting unit;
    an auxiliary electrode electrically connected to the first light emitting unit and the second light emitting unit;
    a peripheral pad disposed in the peripheral region; and
    a peripheral wire disposed in the peripheral region;
    wherein a portion of the auxiliary electrode is disposed between the first light emitting unit and the second light emitting unit in a top view direction of the display device;
    wherein the peripheral pad is electrically connected with the peripheral wire and the auxiliary electrode, and the peripheral pad is electrically connected with the auxiliary electrode through a plurality of connection regions.

19. The display device according to claim 18, wherein the auxiliary electrode is in one of dot shape, line shape and mesh shape.

20. The display device according to claim 18, further comprising a light shielding layer disposed between the first light emitting unit and the second light emitting unit in the top view direction of the display device, wherein a minimum distance between an outline of the light shielding layer projected on the substrate and an outline of the auxiliary electrode projected on the substrate in the top view direction of the display device is greater than or equal to 0.5 μm and less than or equal to 10 μm.

* * * * *